United States Patent
Cornelison et al.

[11] Patent Number: 5,319,929
[45] Date of Patent: Jun. 14, 1994

[54] CATALYTIC CONVERTER SYSTEM

[75] Inventors: Richard C. Cornelison; William A. Whittenberger, both of Hiram, Ohio

[73] Assignee: W. R. Grace & Co.-Conn., New York, N.Y.

[21] Appl. No.: 926,045

[22] Filed: Aug. 5, 1992

Related U.S. Application Data

[63] Continuation-in-part of Ser. No. 587,219, Sep. 24, 1990, abandoned, which is a continuation-in-part of Ser. No. 196,301, May 20, 1988, abandoned, and Ser. No. 524,284, Apr. 16, 1990, abandoned.

[51] Int. Cl.⁵ .............................................. F01N 3/28
[52] U.S. Cl. .................................... 60/274; 60/300;
      219/501; 323/272; 422/174; 422/180
[58] Field of Search ................ 60/300, 299, 274;
      422/174, 180; 219/501; 323/272

[56] References Cited

U.S. PATENT DOCUMENTS

| | | | |
|---|---|---|---|
| 4,366,522 | 12/1982 | Baker | 323/272 |
| 4,814,931 | 3/1989 | Kugelman | 323/272 |
| 4,888,471 | 12/1989 | Thorax | 219/501 |
| 4,928,485 | 5/1990 | Whittenberger | 422/180 |
| 5,146,743 | 9/1992 | Maus | 60/300 |

FOREIGN PATENT DOCUMENTS 2333092 1/1975 Fed. Rep. of Germany ...... 422/174

Primary Examiner—Douglas Hart
Attorney, Agent, or Firm—Edward J. Cabic

[57] ABSTRACT

An exhaust system for an internal combustion engine adapted to correct the problem of pollution occurring at start-up and during at least initial engine running, and characterized by an electrically heatable catalytic converter and, desirably, a separate unheated conventional catalytic converter in tandem relation. The system also provides means for providing electrical power greater than 500 watts for 2 seconds or more whereby the temperature of the catalyst is raised and maintained at least 650 F. An advantage of preferred embodiments is that there is provided a substantially improved means for augmenting conventional catalytic converter exhaust systems for modern requirements by inserting in the exhaust system an electrically heatable catalytic converter for conversion of pollutant material operative prior to, during and after start-up. Power switching means are provided for heating an electrically heatable catalytic converter and are characterized by at least one actuatable solid state switch, preferably in combination with means for actuating said switches.

94 Claims, 7 Drawing Sheets

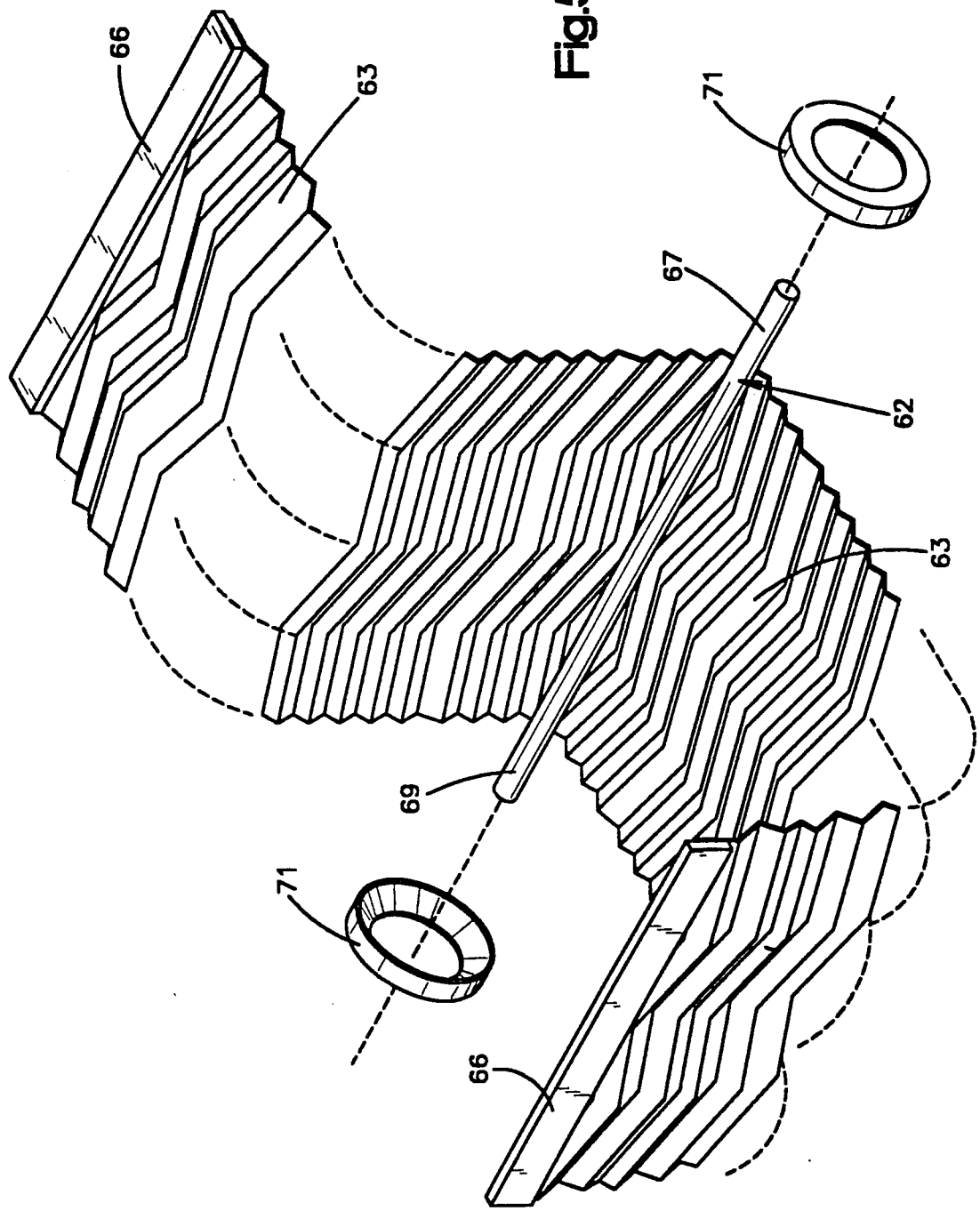

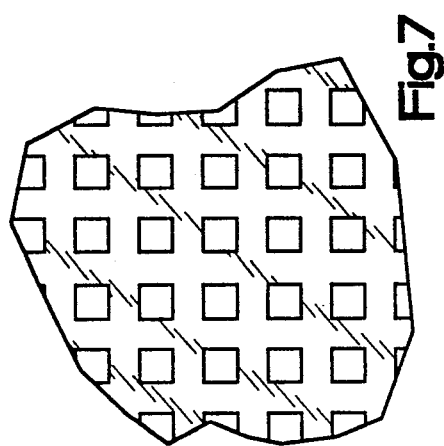
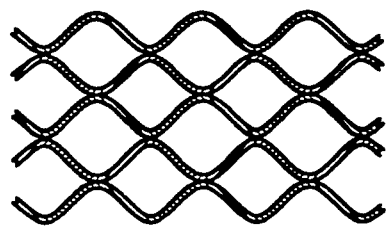
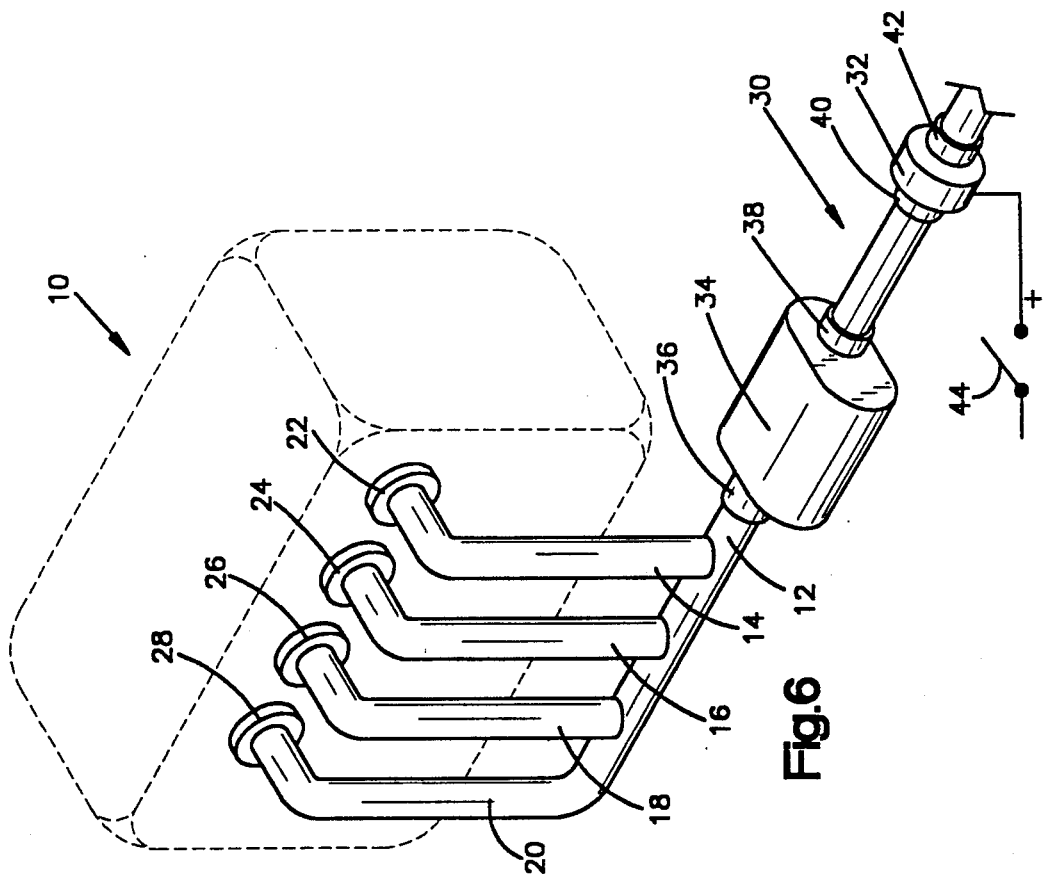

CATALYTIC CONVERTER SYSTEM

RELATED APPLICATIONS

This application is a continuation-in-part of our copending application Ser. No. 587,219 filed Sep. 24, 1990, which was in turn a continuation-in-part of copending application Ser. No. 196,301 filed May 20, 1988 and a continuation-in-part application Ser. No. 524,284 filed Apr. 16, 1990 all now abandoned.

This invention relates to a catalytic converter system for removal of pollutants from exhaust streams that are well below the temperature at which conventional catalysts oxidize organic gases, and more particularly, to an exhaust system including an electrically heatable catalytic converter (EHC) desirably, albeit not essentially, in tandem relation to a catalytic converter which is not electrically heatable. In the case of exhaust streams from internal combustion engines, the invention contemplates compression ignited (diesel), spark ignited, stationary, or mobile, or a gas turbine engine. Power supplied to the heater is governed by an arrangement of solid state switches.

BACKGROUND OF THE INVENTION AND PRIOR ART

The purpose of a catalytic converter is to convert pollutant materials in engine exhaust, e.g., carbon monoxide, unburned hydrocarbons, nitrogen oxides, etc. to carbon dioxide, nitrogen and water. Conventional catalytic converters utilize a ceramic honeycomb monolith having square or triangular, straight-through openings or cells; catalyst coated alumina beads; or a corrugated thin metal foil honeycomb monolith having a catalyst carried on or supported by the surface, which surface is typically wash coated with one or more metal oxides, such as alumina, ceria, lanthia, or combinations thereof, and a catalyst. The catalyst is normally a noble metal, e.g., platinum, palladium, rhodium, ruthenium, or a mixture of two or more of such metals. The catalyst catalyzes a chemical reaction whereby the pollutant is converted to a harmless by-product which then passes through the exhaust system to the atmosphere. However, this conversion is not efficient whenever the exhaust gases are relatively cold. To have high conversion efficiency, the catalyst and the surface of the converter with which the exhaust gases come in contact must be at a minimum temperature above about 200 F., e.g., 390 F. for carbon monoxide, 570 F. for volatile organic compounds (VOC), and 1000 F. for methane or natural gas. Otherwise the conversion to harmless by-products is poor and cold start pollution of the atmosphere is high. For example, about 80% of automotive pollution occurs within the first two minutes of engine operation. Once the exhaust system has come to its operating temperature, the catalytic converter is optimally effective. Hence, it is necessary for the relatively cold exhaust gases be heated or contact a hot catalyzed surface to effect satisfactory conversion at start-up.

To achieve rapid heating of the catalyst in a metallic monolith, it is necessary to draw power from a voltage source, or other source of electric energy, e.g., a battery or a capacitor device (such as the new Isuzu "electric power storage" device developed by Isuzu Motors Ltd.) until the desired temperature is reached. In an automotive vehicle, this source of energy is usually a 12 volt or a 24 volt battery, although a battery system supplying higher voltage may be used. As indicated, a battery, or a capacitor battery or, if an immobile source, a conventional AC or DC power supply may also be used as a source of energy. To accomplish this end, it has been found that one or more actuatable solid state switches connected in parallel, such as metal oxide semiconductor field effect transistors (MOSFETs) together with means for actuating such devices in unison (a gate driver) may conveniently be used. This system in vehicles enables drawing high power loads for a short period of time to achieve the desired temperature in from broadly upwards of 0.5 second, desirably above about 2 seconds, e.g., from 2 to 30 seconds, and preferably from 2 to 60 seconds of precrank preheating, and, if necessary depending upon the specific application, from 0 to 60 seconds of postcrank heating.

Reference may be had to U.S. Pat. No. 3,768,982 to Kitzner dated Oct. 30, 1973. In this patent, heat from a centrally located electric heater is transferred by conduction through a monolithic catalyst support to heat the catalyst to optimum operating temperature. Reference may also be had to U.S. Pat. No. 3,770,389 to Kitzner dated Oct. 30, 1973 which discloses a central electrically heated core within a ceramic monolith. The heating core is formed of metal sheets, one corrugated, the other flat, coated with alumina and also bearing a catalyst. The metallic core is heated electrically by virtue of its own electrical resistance. However, heating by conduction requires too long (a matter of minutes) to be practical in solving the problem of atmospheric pollution at start-up.

Reference may also be had to U.S. Pat. No. 4,711,009 to Cornelison and Retallick dated Dec. 8, 1987 for details of a process for the preparation of an accordion folded thin stainless steel foil honeycomb with an alumina coating and a catalyst on the surface thereof. This patent is incorporated herein by reference thereto.

Reference may also be had to International PCT publication number WO 89/10471 filed Nov. 2, 1989 which discloses electrically conductive honeycomb catalyst support units useful in automobiles. To obtain a suitable electrical resistance between 0.03 and 2.0 ohms, the honeycomb body is subdivided electrically, cross-sectionally and/or axially, by gaps and or electrically insulating intermediate layers or coatings so that at least one electrical current path having the desired resistance is obtained. Heating is controlled by a timed relay. Separate catalytic converters in the exhaust line, one or more electrically heatable, the other conventional, are disclosed. The minimum resistance disclosed is 0.03 ohms which when placed in a nominal 12 volt electrical system, as disclosed, may be expected to draw a current of no more than about 300 amps at the catalyst when the various voltage drops and resistances are considered. This power level has been found to be too low for effective rapid heating of electrically heatable units within from 0.5 to 60 seconds and, even if the monolith could be heated rapidly at this power level, the catalyst tends to cool rapidly to below "light off" temperature after the engine is started because of the initial cool exhaust from the engine. To counteract this cooling effect usually more than 2700 watts (less for smaller engines) are required after engine start-up. It should be noted that on some vehicles, this cooling to a lower temperature is not important if it occurs during a period of time when the engine exhaust emissions are low, in which case a lower power level (down to 500 watts) may suffice. Moreover, subdivision of the monolith into a plurality of discs or units for connection in series is not necessary.

Many millions of automotive vehicles are equipped with catalytic converters, but all are subject to cold-start emissions of what, in at least one state, has been determined to be an unacceptable level. Anticipatory elevation of the catalyst temperature to an optimum operating level before start-up is expected to be mandated for many automotive vehicles.

Moreover, the systems of the present invention will achieve an effective pollutant removing temperature, or "light off" temperature in about two seconds depending upon the power delivered from the source of electrical energy. This compares with over five minutes for converters with no auxiliary electrical heating means or those which depend upon heat conduction as the mode of heat transfer. This is an important distinction if one is obliged to wait for a catalytic converter to achieve "light off" or optimum operating temperature before starting the engine. Again, it is important to note that a major amount of pollution due to exhaust gases occurs in the first two minutes of engine operation. Some applications of the devices contemplated hereby use power supplied continuously, i.e., without a power modulating system.

BRIEF STATEMENT OF THE INVENTION

Briefly stated, the present invention is in an exhaust system. This includes internal combustion engines having an exhaust manifold and an exhaust pipe, and having in said exhaust pipe one or more electrically directly heatable catalytic converter characterized by an exhaust inlet and an exhaust outlet, and one or more separate not directly heatable catalytic converters, also having an exhaust inlet and an exhaust outlet and being free of electrical heating means, and being in tandem relation with said electrically heatable catalytic converter or converters. These may be in the same housing and be spaced therein or juxtaposed, or in separate housings. The system also includes means for providing an electric current, preferably a modulated electric current, greater than about 150 amps in the case of a 12 volt system, or power greater than 500 watts, to said electrically heatable catalytic converter for from 0.5 or more seconds, desirably above 2 seconds, e.g., 2 to 30 seconds, and preferably 2 to 60 seconds, whereby heating of the unsubdivided, or unitary, catalytic core to "light-off" temperature is achieved. Proportionally less current is required for higher voltage systems, for example, up to 120 volts AC or DC, to achieve the same power level.

Power is switched through one or more actuatable metal oxide semiconductor field effect transistors, or MOSFETS, connected in parallel together with means for actuating them in unison The electrically heatable catalytic converter body is desirably formed from a plurality of spirally wound corrugated thin metal strips having a length such that each conductive length (from center to periphery, for example) has a resistance at 70 F. of from 0.05 to 5.0 Ohms. When electrically connected in parallel fashion in, for example, a 12 volt system, the catalytic body formed from these small strips has a resistance of 0.005 to 0.067 ohms. In the case of higher voltage systems, the catalytic body is configured to provide resistances as set forth in Table I below. It should be noted that the values in Table I result in available power to the monolith of approximately 500 watts to 12000 watts in each case.

An alumina-containing washcoat on each side of each strip is used in these devices, thus facilitating manufacture. The washcoat has a breakdown voltage, or dielectric strength of about 1.5 v, but because of the mechanical construction, contiguous points are at about the same potential and hence, there is no arcing and consequent damage to the core. Special washcoats can be employed that will provide a higher dielectric strength as may be required for higher voltage power supplies, or where higher interlaminar voltages are present.

The present invention also applies to accordion folded corrugated thin metal monoliths such as disclosed in Ser. No. 196,301 filed May 20, 1988, whose continuation application, Ser. No. 483,978 now U.S. Pat. No. 4,976,929 dated Dec. 11, 1990.

The present invention is applicable to intermittant or continuous duty in any exhaust stream, although for illustrative purposes, the invention will be described in conjunction with the exhaust system of an automotive internal combustion engine.

BRIEF DESCRIPTION OF THE DRAWINGS

The invention will be better understood by having reference to the annexed drawings showing preferred embodiments of the invention and wherein:

FIG. 5 is a perspective view of a corrugated thin metal core member and a retaining ring for collecting the projecting pins in preparation for welding.

FIG. 6 is a diagrammatic illustration showing the installation of an electrically heatable catalytic converter such as shown in FIGS. 2, 2a and 3, but, in downstream tandem relation with a conventional catalytic converter in an exhaust system. This arrangement has the advantage that the electrically heatable catalytic converter is shielded by the conventional converter from potentially damaging thermal exposure, masking agents, and catalyst poisons which might otherwise adversely affect the electrically heatable catalyst.

FIG. 7 is an enlarged view in cross-section of a fragment of a ceramic honeycomb having square openings as currently used for control of automotive emissions.

FIG. 8 is a view in cross-section on an enlarged scale, of a fragment of a corrugated thin metal honeycomb showing the openings therein.

DETAILED DESCRIPTION OF THE INVENTION

As indicated above, the present invention provides a means of simultaneously heating and catalyzing an exhaust stream. In a specific embodiment, it provides an efficient means for improving, or redesigning, or reconfiguring a conventional exhaust system which includes one or more conventional catalytic converters of either the ceramic or corrugated metal foil type in series with a rapidly electrically heatable catalytic converter, whereby pollutant materials in the exhaust stream at start-up can be converted to harmless by-products prior to exhausting to the atmosphere. It should be noted that in smaller engine displacement vehicles, equivalent results are obtained insofar as pollutant removal is concerned, when the electrically heatable catalytic converter is located in the exhaust system either before or after the conventional catalytic converter which is not electrically heated. Location of the EHC upstream of the conventional catalytic converter or converters is preferred to take advantage of engine heat. Usually, the conventional catalytic converter is located upstream of the muffler and any resonator.

In the case of some applications, a non-electrically heatable catalytic converter may or may not be used in conjunction with an EHC, as the EHC can serve as the main or sole converter. In some cases, where sufficient chemical energy is present, little or no additional electrical energy may be required after the EHC achieves light-off temperature.

Figure 3:
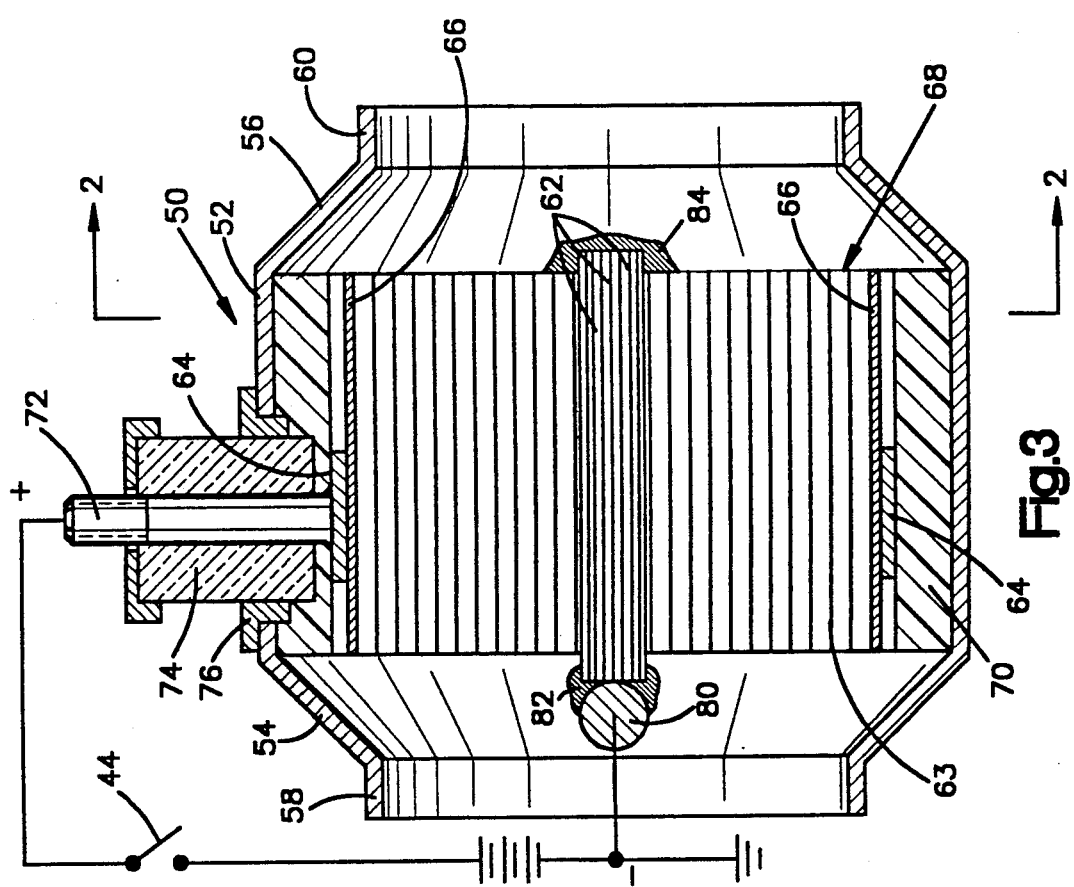
FIG. 3 is a cross-sectional view along the axis of an electrically heatable catalytic converter useful in accordance with this invention.

The electrically heatable catalytic converters described herein are readily inserted in the exhaust line adjacent to the exhaust manifold and upstream of the conventional catalytic converter(s), or in the reverse relation to the conventional catalytic converter, by cutting and removing a 3.5" to 4" section of the exhaust line and inserting a structure such as shown in FIG. 3 in place of the removed section, and welding or brazing it in place. Electrical connections are made in an appropriate manner.

Figure 1:
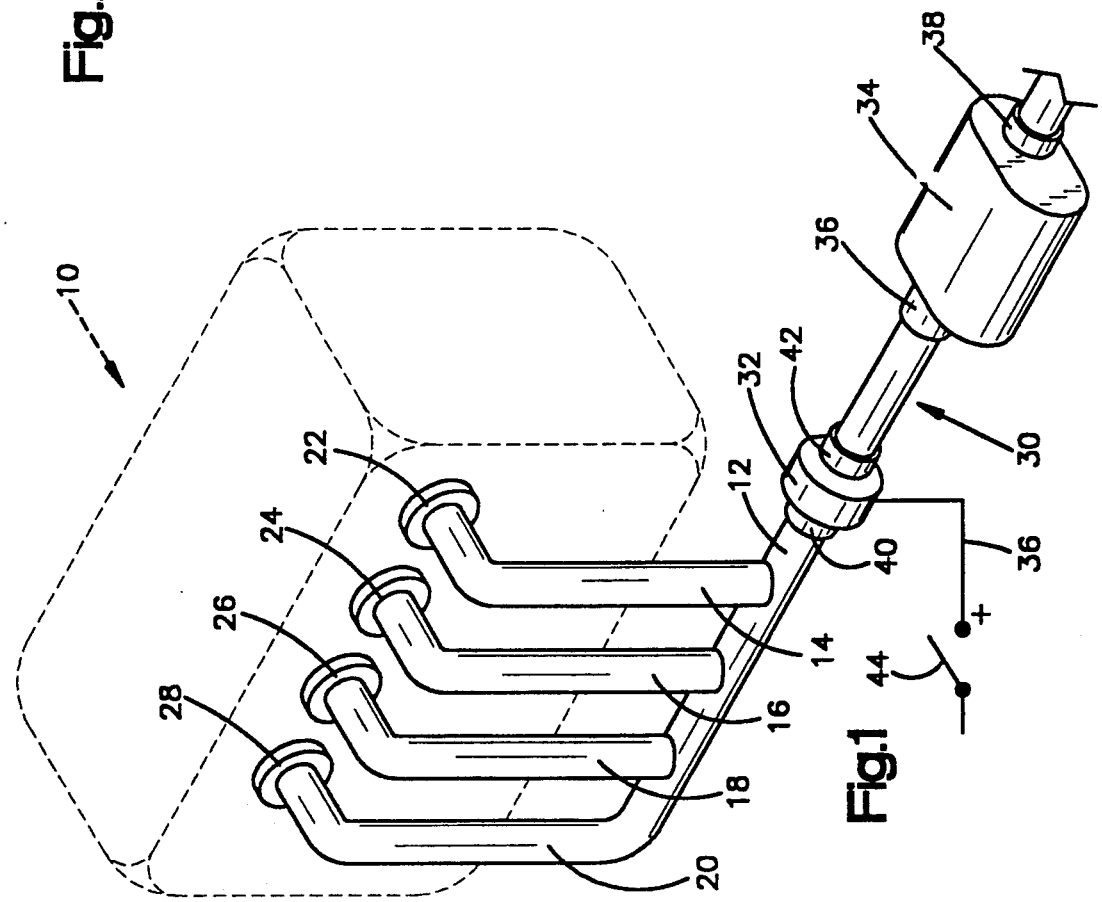
FIG. 1 is a diagrammatic illustration of an exhaust system in accordance herewith an showing an engine in phantom having an exhaust manifold and an exhaust pipe with an electrically heatable catalytic converter, such as shown in FIGS. 2, 2a and 3, and a regular or conventional catalytic converter in tandem relation in said exhaust system. The term "conventional catalytic converter" as used herein means that the converter is not electrically heatable from a battery source, and applies to either a nonheated catalyst carrying ceramic honeycomb monolith, or a nonheated catalyst carrying corrugated thin metal monolith.
Figure 4:
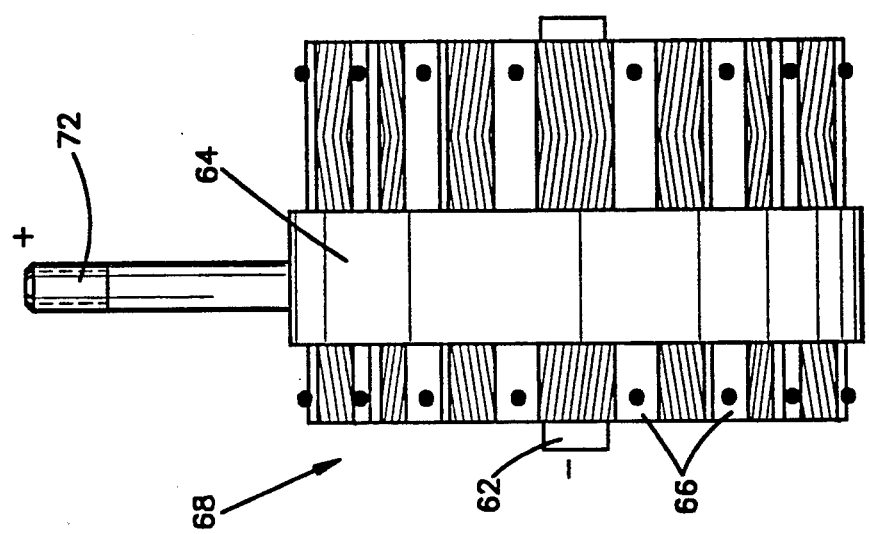
FIG. 4 is a side view of a catalytic converter core assembly showing the conductor strips attached to the corrugated foil and an encircling band having an electric terminal attached.

Referring more particularly to FIG. 1 of the annexed drawings, there is here shown a diagrammatic representation of an internal combustion engine 10 (shown in block phantom) having a manifold 12 connected to individual exhaust lines 14, 16, 18 and 20 leading from exhaust ports 22, 24, 26 and 28, respectively, in the engine block 10. At the downstream end of the manifold 12, there is inserted in the exhaust system, generally indicated at 30, an electrically heatable catalytic converter 32 and shown in greater detail in FIGS. 2, 2a, 3 and 4. The distance "a" in FIG. 1 is, for most purposes, less than 12 inches. Also located in the exhaust line 30 is a conventional catalytic converter 34 which is not electrically heatable. A heavy electric cable 36, e.g., a #2 wire, capable of carrying a current greater than 60 amps, e.g., 500 amps, up to about 1100 amps in the case of a 12 volt system, leading from the positive terminal of the battery through a suitable switching device, such as a number of parallel connected MOSFETs (FIG. 9) is connected in series with the electrically heatable catalytic converter 32 to complete the electric circuit. The negative terminal of the source of electrical energy is either directly connected to a separate ground lug on the EHC, which is preferable, or less desirably in the case of a 12 volt system, attached to the chassis or engine block and thus indirectly connected to the exhaust manifold 12. It is undesirable on 12, 24 or 36 volt systems, for example, for the only ground return to the battery to be via the exhaust pipe to the frame or chassis because of the relatively high resistance and variable resistance of the exhaust pipe and frame connectors as well as electrogalvanic action. These resistances can lead to substantial power losses and consequent poor EHC performance. For higher voltage systems, the ground path may be established through the exhaust pipe and engine or chassis.

In this embodiment, the heat content and chemical energy of the exhaust gas aids in heating the electrically heatable catalytic converter 32 at start-up thereby reducing the electrical power required to achieve catalyst "light-off" temperature, e.g., 600 F. to 1300 F. In automotive service, the catalyst temperature is generally in the range of 1000 F. to 1500 F. with temperature excursions to as high as 2100 F.

Referring now to FIG. 6, this illustration is similar to FIG. 1 described above. However, in this case, the relative positions of the conventional catalytic converter and the electrically heatable catalytic converter are reversed, the latter being downstream of the effluent from the conventional catalytic converter. Similar numbers FIG. 6 identify parts shown in FIG. 1. This is one embodiment for engines under 3.0 liters displacement because the EHC is protected from undue thermal exposure and from possible catalytic poisons, e.g., sulfur. For larger engines, i.e., greater than about 3.0 liters displacement, mounting the EHC adjacent to the engine is the preferred location where exhaust heat allows less electrical power to be used to reach light-off temperature. Air or oxygen may be introduced into the exhaust line upstream of the conventional catalytic converter, or upstream of the EHC, to aid in the oxidation reaction.

Thus, there is shown in FIG. 6 an engine block in phantom, an exhaust manifold 12 attached to exhaust pipes 14, 16, 18 and 20 in turn attached to exhaust ports 22, 24, 26 and 28, respectively, in the engine block 10. The downstream end of the manifold 12 is attached to the conventional catalytic converter 32 at its inlet end 36 and the exhaust pipe 30 is attached to exit 38 from the converter 34. The exhaust pipe 30 enters the EHC converter 32 at its inlet 40 and exits through the outlet 42. As shown, the EHC is downstream of the conventional catalytic converter. The "conventional" catalytic converter may comprise a steel housing with end cap adapters to the exhaust pipe diameter and a catalyst containing ceramic monolith, catalyst coated alumina beads, or a corrugated thin metal foil monolith as described, for example, in the aforesaid U.S. Pat. No. 4,711,009, supra.

Where the engine is constructed with two manifolds, as in V-8 or V-6 engines, two EHC's may be used, one in each of the two exhaust systems in the same manner as shown in FIGS. 1 or 6.

In operation, the EHC as described below in reference to FIG. 3, for example, is connected in a suitable electric circuit (not shown in FIGS. 1 and 6) by closing a normally open switching circuit 44 (FIG. 3) containing at least one, and preferably a plurality of MOSFET's in parallel (FIG. 9) until a desired temperature is reached in a period of time, e.g., 0.5 to 60 seconds, or until the exhaust system reaches normal operating temperature. As indicated above, in some applications, power may be supplied continuously during operation of the exhaust system. At such time as the main catalytic converter has achieved optimum temperature for desired conversion of pollutant ingredients, application of electrical power may be discontinued or controlled at a much lower energy level. Also, these switches may be would limit the control of power available to the electrically heatable catalytic converter to about 2400 watts. With smaller engine displacement vehicles, e.g., up to 3 liters, lower available power, e.g., 500 watts and up is common. These low energy levels can impose limits on the useful range of EHC's at start-up, both in terms of achieving (1) short heat up times, and (2) maintaining temperatures after engine start-up high enough to control emissions. It has now been found that an actuatable switch system, including, for example, a plurality of MOSFET field effect transistors together with means for actuating them in unison, e.g., a gate driver and associated logic control circuits, can be used effectively to modulate the power required for quick heating of the EHC, in preference to (a) solenoids and relays, or (b) subdividing the monolith to reduce current draw in the individual segments. Because the internal resistance of field effect transistors increases with increasing temperature, they can be wired in parallel without regard to load sharing considerations. Generally, each MOSFET can switch 25 to about 50 amps without appreciable voltage drop. When from 4 to 25 of such switches, e.g., 16–18, are connected in parallel, currents of from above 50 amps, e.g., 500 amps, to as high as 1200 amps or more, can be switched. The use of MOSFETS results in better use of the power available from the battery. At a 750 amp level, about 5000 watts of power is available to the EHC using a simple 12 volt battery system. Higher EMF voltage sources, up to 60 or more volts, yield higher power (watts) delivered to the EHC, as well as higher electrical efficiency, as shown in Table I below. In a 12 volt system operating at 500 amps, about 2.5 volts are lost due to battery internal resistance and about 2.8 volts are lost due to cable resistance and internal switch resistance, whereas at higher voltages, system IR losses are reduced, resulting in higher electrical efficiency. (See FIG. 10.)

TABLE I

| | LOW POWER CASE | | | | | HIGH POWER CASE | | | | |
|---|---|---|---|---|---|---|---|---|---|---|
| Nom Bat | Batt EMF | Cat EMF | Cat Ohms | Amps | Cat Watts | Batt EMF | Cat EMF | Cat Ohms | Amps | Cat Watts |
| 12 | 11 | 10 | .067 | 150 | 1500 | 9 | 5.5 | .005 | 1100 | 6000 |
| 24 | 23 | 22 | .32 | 68 | 1500 | 21 | 18 | .027 | 667 | 12000 |
| 36 | 35 | 34 | .77 | 44 | 1500 | 33 | 30 | .075 | 400 | 12000 |
| 48 | 47 | 46 | 1.4 | 33 | 1500 | 45 | 42 | .147 | 286 | 12000 |
| 60 | 58 | 58 | 2.2 | 26 | 1500 | 57 | 54 | .243 | 222 | 12000 | turned back on after engine start-up to maintain temperature, which temperature, in many cases, will drop in the absence of additional power, because of the cool mass flux in the initial exhaust gas flow. Moreover, these switches can be turned on and off rapidly so as to provide precisely the right amount of power to balance the cooling effect. Closing of the MOSFET switch may also turn on a "wait" light visible to the driver, and/or disable the ignition switch until minimum catalyst operating temperature is reached as sensed, for example, by a conventional thermocouple, or by the passage of time.

Electrically heatable catalytic converters and their switching circuits have, until this time, been somewhat limited in power capacity. For highly reliable operation, most current switching devices useful in a 12 volt system, (solenoids and relays) are limited to about 200 amps, maximum, whereas a high capacity internal combustion engine electrical system utilizing as a voltage source, a 12 volt vehicle battery, can deliver up to 1100 amps for short periods of time, and alternators in 12 volt systems, 75 to 150 amps continuously. For a 12 volt electrical system on an automotive vehicle, solenoids EHC's need high power levels for two distinct purposes. First, EHC's need to be heated to at least about 650 F. to achieve light-off. In the case of internal combustion engines in vehicles electrical heating may be needed before, during and/or after the engine is started so that the initial pollutants emitted can be converted by the EHC. Generally, the more power available at a given voltage for this purpose, the shorter the heat up time. With smaller displacement engines of less than 3 liters, or highly efficient engines, less power, e.g., 500 to 1000 watts, is sufficient because critical reduction in pollution levels in smaller cars is more nearly readily achieved. Higher levels of pollution control mean that the catalytic monolith needs to be larger, more massive, and therefore, more effective as a catalyst, and generally means that a given monolith can be heated more quickly. In lower power applications, 2-10 MOSFETS connected in parallel can be used.

The second need for power comes after the engine has started. The exhaust gas from a cold engine for the first two minutes or so after starting from ambient conditions needs to be raised by the EHC to at least 600 F. so as to achieve light-off temperature. Further, sufficient power needs to be applied over an extended time so that the EHC is not quenched by the cooler exhaust gases. The energy needed for the EHC to achieve a suitable level of emissions control depends on the engine size and the exhaust flow rate. Large V-8 engines (5.0 liters and above) require an EHC rated up to 5000 watts to prevent start up quenching. Small engines, e.g., 1.5 to 2.5 liters, require as little as 500 watts. Power required after start-up is supplied from the alternator, either directly or through a rectifier system, or from the vehicle battery, or an energy storage capacitor device. Often it will be found desirable to include in parallel or in conjunction with suitable isolating circuitry with the engine battery, an auxiliary battery of, for example, from about 3 to about 12 volts, e.g., 6 volts, dedicated primarily to the EHC alone. The auxiliary battery preserves the main battery against rapid depletion as might occur with a single battery adapted to run the engine, the electrical equipment, the electronics and the EHC.

The location of the electrically heatable catalytic converter is mostly a matter of choice although the specific application may direct the choice. However, location just upstream of the conventional catalytic converter is generally desired. If fuel-bound poisons are present, e.g., sulfur and phosphorus, which tend to inhibit the catalyst employed in the EHC, or if the manifold heat is too high and potentially injurious to the EHC, the EHC can be moved downstream of the conventional catalytic converter.

Referring now to FIG. 3, there is here shown in axial cross-section an electrically heatable catalytic converter (EHC) generally indicated at 50. The EHC is provided with a stainless steel housing 52 having flared end caps 54 and 56 and nipples 58 and 60 integral therewith adapted to accommodate a standard exhaust pipe, e.g., a 2.5" internal diameter. The housing 52 contains a single monolith 68 formed in the manner indicated above, of refractory metal oxide coated, e.g., gamma alumina and ceria, corrugated thin ferritic stainless steel, or nickel-containing alloys, e.g., Haynes 214 (see U.S. Pat. No. 4,671,931 dated Jun. 9, 1987 to Herchenroeder for the composition of the nickel/chromium/aluminum/iron alloy) defining a plurality of cells permeable to exhaust gas. The metal oxide coating is very thin, e.g., about 0.0005" to 0.002". Ferritic Stainless steel and Haynes 214 are examples of high temperature resistive, corrosion resistant metals particularly useful herein.

FIG. 8 shows on an enlarged scale, a fragment of the monolith as it appears in the direction of exhaust gas flow. The corrugations may be straight through as they are in the case of an extruded ceramic monolith (FIG. 7), although a herringbone or chevron pattern for the corrugations is desired to provide a mixed flow to the gases and hence, better contact with the catalyst. The herringbone configuration also provides a nonnesting relationship between contiguous layers of the corrugated foil thus reducing material usage and having a positive effect on thermal inertia and cost. The corrugated thin metal foil may be formed by a process such as described in the aforesaid U.S. Pat. No. 4,711,009 to provide a number of parallel resistance paths of equal resistance. Conventional flat and straight corrugated metal foil presents unequal resistance paths unless the thickness of the flat foil is about 35% thinner than the corrugated foil whereby paths of about equal resistance are provided. For purposes of this invention, the corrugations generally have an amplitude of from about 0.01" to about 0.15", e.g., 0.07", and a pitch or wave length of from about 0.02" to about 0.25", e.g., 0.08". The chevron or herringbone pattern generally defines an angle of from about 3 degrees to about 20 degrees, e.g., 6–7 degrees, with a line normal to the edges of the foil strip. The metal is preferably a thin (0.0010" to 0.003", e.g., 0.0016" nickel alloy, such as that described in U.S. Pat. No. 4,671,931 dated Jun. 9, 1987 to Herchenroeder et al. A specific example of this alloy contains 75% nickel, 16% chromium, 4.5% aluminum, 3% iron, trace amounts of one or more rare earth metals, 0.05% carbon and steel making impurities. Another useful alloy is ferritic stainless steel described in the patent to Aggen U.S. Pat. No. 4,414,023 dated Nov. 8, 1983. This metal alloy contains from 3% to 10% by weight aluminum either on the surface or in the body of the alloy, and has a thickness of 0.0015". Specific alloys consist essentially of 8% to 25% chromium, e.g., about 20% chromium, 3% to 8% aluminum, e.g., 5% aluminum, 0.002% to 0.05% of at least one rare earth metal selected from cerium, lanthanum, neodymium, yttrium and praseodymium, the total of the rare earths being up to 0.06%, up to 4% silicon, 0.06% to 1.0% manganese, and normal steel making impurities of less than 0.05% carbon, less than 0.050% nitrogen, less than 0.020% oxygen, less than 0.040% phosphorus, less than 0.030% sulfur, less than 0.50% copper, less than 1% nickel, the sum of magnesium and calcium being less that 0.005%, the remainder being iron.

Conveniently, the width of the foil is 1.0" to about 3.5". Foil 3.5" wide by 0.0016" thick has a resistance of 0.10 ohm per foot of length at 70 F. When the temperature reaches about 500 F., the resistance of the strip is about 0.12 Ohm. Haynes 214 (see above) is also a highly useful nickel-containing alloy.

The corrugated metal foil is conveniently provided with a preapplied washcoat comprising alumina, e.g., (alumina/ceria) which is baked or calcined onto the surface, and which provides a very satisfactory surface on which to deposit the noble metal catalyst. The alumina, or aluminum oxide, in the gamma form is desired. Other refractory metal oxides, or mixtures of oxides may be used as the washcoat, e.g., titania, titania/ceria, titania/alumina, zirconia, silica, etc. As indicated above, reference may be had to U.S. Pat. No. 4,711,009 for a procedure for corrugating, washcoating, and application of a noble metal catalyst to the foil.

Figure 2:
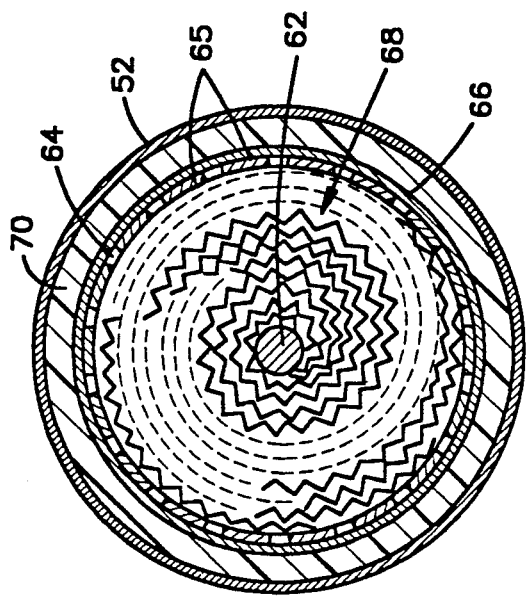
FIG. 2 is a cross-sectional view on a slightly reduced scale, of the electrically heatable catalytic converter of FIG. 3 as it appears in the plane indicated by the line 2—2 in FIG. 3.
Figure 2A:
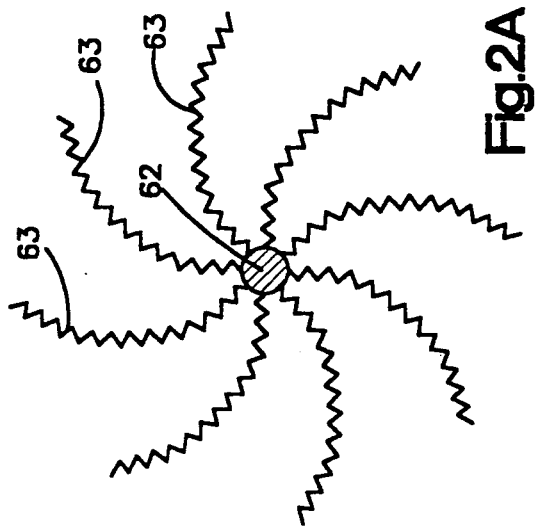
FIG. 2a is a representation of the structure of the central core before it is spirally wound for insertion in the casing shown in FIG. 3.

Strips 63 of the corrugated foil cut to a predetermined length, e.g., 28.5" by 2" wide, may be secured at the midpoint of the strip 63 to a metal rod 62 of 0.062" to 0.150" diameter, e.g., 0.094" diameter by resistance welding, the rod 62 being enwrapped by the overfolded foil. Overfolding of the pattern corrugated (herringbone) foil strips prevents nesting of contiguous layers, and provides a pair of foil segments 63. From 8 to 16 or more pairs, e.g., 14 pairs, may be collected to form a single core 68. The rods 62 are longer than the width of the thin metal foil strip 63 and project about ⅜ths" at each side. The free ends of the overfolded strip are wire brushed free of alumina coating, and have metal strips or wires 66 welded to or otherwise secured thereto to provide good electrical contact. The free ends of the projecting wire rods 67 and 69 are gathered and inserted through rings, e.g., ring 71. Then the ends of the projecting rods 67 and 69, respectively, are welded together and to the rings 71 to form weldments 82 and 84 and a central core of bars 62 (FIG. 3). This subassembly without separate intervening insulating means to separate contiguous foil strips 63, is then wound spirally as shown in FIG. 2 by rotating the subassembly about the axis formed of the bars or rods 62. The tightly wound corrugated foil body 68 is then provided with a flexible shell or conductive binder ring 64 around the spirally wound body 68 with the strips 66 attached at the outer periphery and the binder ring 64 seam welded in place and spot welded to the strips 66. See FIGS. 4 and 5. The strips 66 may be replaced by wires or rods. The strips 66, or wires or rods 66, are desirably formed of a weldable, highly conductive, high temperature withstanding metal. A 90-95% nickel alloy including manganese, iron and aluminum plus minor amounts of steel making impurities, is a preferred alloy for the elements 66. Alternatively, the binder ring 64 may be formed of half shells, one having a suitable opening for the terminal assembly 72, 74 and 76, and such shells later seam welded together. This assembly is then wrapped in insulation 70 and inserted into the housing 58. The end caps 54 and 56 are the last to be attached as by welding. A conventional thermocouple 55 with leads insulated by insulator 53 and bushing 59 and extending through the housing 52 (FIG. 3) is placed within the foil body. Temperature sensing by measuring the resistance of the metal body is impractical because of the small percentage change in resistance from ambient to the target light-off temperature.

The cell density, or number of cells per square inch, is desirably in the range of from 50 to about 700 cells per square inch, e.g., 100 cells/sq.in. Such relatively high cell densities require corrugation amplitudes of from about 0.02" to about 0.10", and a pitch of from about 0.07" to about 0.20". Cell density is also a function of the shape, size and number of corrugations as well as the thickness of the foil. Generally a modified triangular corrugation pattern in cross-section is preferred (see FIG. 8). Such corrugations have the corrugation apices projecting out of the plane of the thin metal strip, top and bottom, and rounded off at the peaks, to approach a sinusoidal configuration. As indicated above, it is preferred that the foil be corrugated in a herringbone, or chevron, pattern, or as shown in U.S. Pat. No. 4,838,067 to Cornelison dated Jun. 13, 1989. The sides of the chevron define an angle of from 3 to 20 degrees with a line normal to the longitudinal edges of the thin metal strip. The following Table II shows the relationship of the number of cells per square inch (CPSI) to the amplitude (H) and the pitch (L) of the corrugations.

TABLE II

| CPSI | H | L |
|------|-------|--------|
| 50   | 0.100 | 0.200  |
| 100  | 0.0690 | 0.145 |
| 320  | 0.0375 | 0.0838 |
| 510  | 0.0270 | 0.0720 |

The assembly formed as above described is then wrapped in a layer of insulation 70, e.g., a ceramic felt material, such as described in U.S. Pat. No. 3,916,057 to Hatch et al dated Oct. 28, 1975, of about 0.25" thick, and the whole assembly encased in the stainless steel housing 52. The ceramic felt 70 (FIG. 3) serves as a thermal insulator, an electrical insulator, and a mechanical take-up device to hold the core 68 in the housing 52. In a specific embodiment, the cross-sectional area of the honeycomb core permeable to exhaust gas is about 8 to 12 square inches compared with about 24 square inches in a conventional catalytic converter.

To enable the attachment of an electrical current carrying line to the binder ring 64 and the bars 66 surrounding the spirally wound core 68, there is provided a terminal 72 extending through the housing 52, and welded at its inner end to the binder ring 64. The terminal 72 may be threaded at its outer end for convenient attachment of an electrical cable. The terminal 72 is insulated from the housing 52 by a ceramic sleeve 74 which is held in a suitable bushing 76. A metallic cap 78 assures good electrical contact with the terminal 72.

The opposite pole, or negative pole, is connected from the outside of the housing 52 by a transversely extending bar 80 welded at each end to the inside of the housing 52 and to which the central core of bars 62 is welded as at 82. The downstream end of the core is welded as at 84 to the central cluster of projecting bars 62 defining the center of the core 68. Thus, the electrical circuit is completed from the central core composed of rods 62, through the foil members 63 to the spaced bars 66, the shell or band 64 and the terminal 72. The terminals of the engine battery (shown diagrammatically in FIG. 3) are directly attached through switches, for example, to the EHC 50, or 32 in FIGS. 1 and 6.

The temperature of the core 68 is conveniently sensed by a thermocouple 55 extending through the housing 52 with a metal bushing 59. A suitable insulating sleeve 53 and an inner tube 57 wherein the conducting leads from the junction 61 are carried spaced from each other as is known, extends into the interior of the housing 52. The leads terminate in a junction 61 which is embedded in the core 68.

Temperature may also be sensed by the elapse of a predetermined amount of time.

The catalytic converter 50, or 32 in FIGS. 1 and 6, is referred to herein as "electrically heatable." This is to suggest that electrical power may be supplied continuously in the case of stationary applications, or for only a small portion of the time the engine is cold, i.e., before and/or after start-up, or in normal operation, especially in low temperature environments. Electrical power is supplied during start-up, and if necessary, during operation at any time the temperature in the exhaust system falls below a set point. This can be achieved by temperature controls at critical points, e.g., within the respective catalytic converters, which respond to low temperatures to cause reapplication of battery power as may be needed. During the remainder of the time of engine operation, the application of battery power is not necessary, except as may be required by low ambient temperature, as the exhaust temperature and the exothermic nature of the catalytic reaction will, for most purposes, maintain a suitably high temperature within the catalytic converters for efficient conversion of pollutants to harmless gases.

A modulating electronic circuit operated by hardware or software, may be provided to control the actuatable solid state switches mentioned above. FIGS. 9, 10, 11, 12 and 13 relate to such a circuit. In cases where full power is needed, the modulating electronic circuit allows the high current switches to be on all the time. When less power is required, e.g., in a smaller engine, the modulating electronic circuit modulates on and off rapidly to provide a square wave form, with a duty cycle that applies the appropriate amount of power. If the converter were designed to draw 5000 watts when on all the time, and if the engine required only 1000 watts to keep the EHC hot, the circuit would be set up to operate at a 20% load factor.

This modulating technique can be used also during the preheat phase to modulate the power draw, but is most appropriate during the heating phase after the engine has been started. It can also be used in both open and closed loop. In the open loop mode, characteristics of individual engines can be measured or calculated, and the modulating circuit hard wired or programmed to operate on one specific duty cycle. In the closed loop mode, a conventional thermocouple or other temperature sensing device in the EHC provides feedback to the modulating circuit which then modulates the power to hold a specific temperature regardless of the engine operating conditions.

Figure 9:
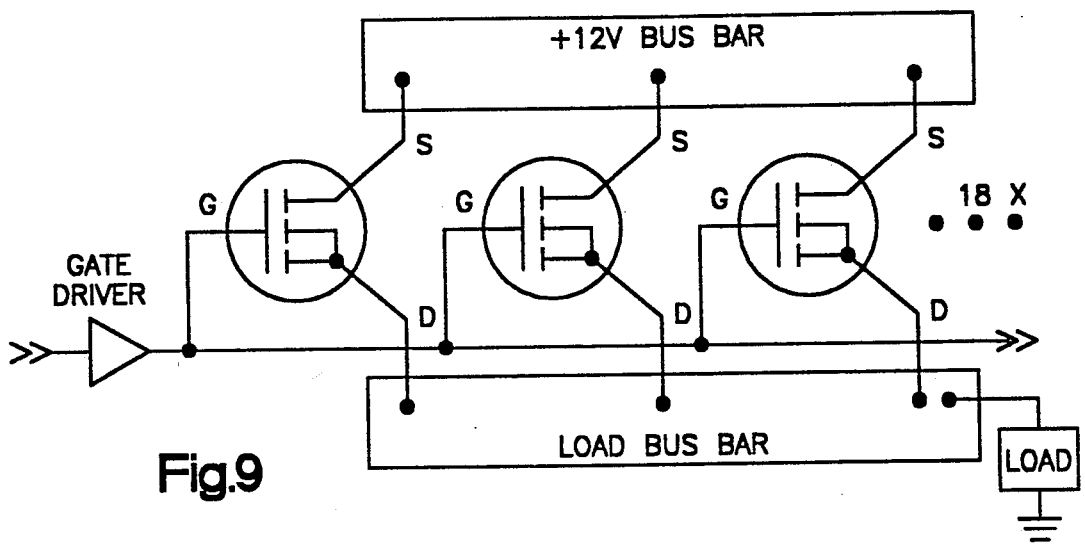
FIG. 9 is a diagram of an actuatable solid state switch arrangement together with a driver for actuating the switches in unison and useful in an EHC solid state controller for heating a unitary electrically heatable catalytic converter or "load."

The limitations of early time based controllers created a need for a more flexible system that was capable of switching large amounts of current on a 12 volt system, i.e., greater than 75 amps. It has been found that actuatable solid state power controllers, e.g., MOSFETS, typically rated at 20 to 50 amps each, particularly those rated at 50 amps, can be connected in parallel to switch large amounts of current. The internal resistance of these devices increases with increasing temperature. This behavior provides a mechanism by which multiple solid state switches can be operated in parallel and effectively share the load. By placing the switches in parallel, virtually any amount of current can be switched. With this type of solid state switch, the limitation on available power becomes the engine or vehicle battery. For example, 12 volt batteries are readily available that supply 750 or more cold cranking amps. Such power can be transmitted to the EHC monolith, e.g., 63 in FIG. 3. FIG. 9 illustrates the basic arrangement of a high amperage MOSFET switch. The gate driver in FIG. 9 is a device for actuating the solid state power switches in unison and is known to those skilled in the art of solid state electronics. The circuit functions like an amplifier.

Figure 10:
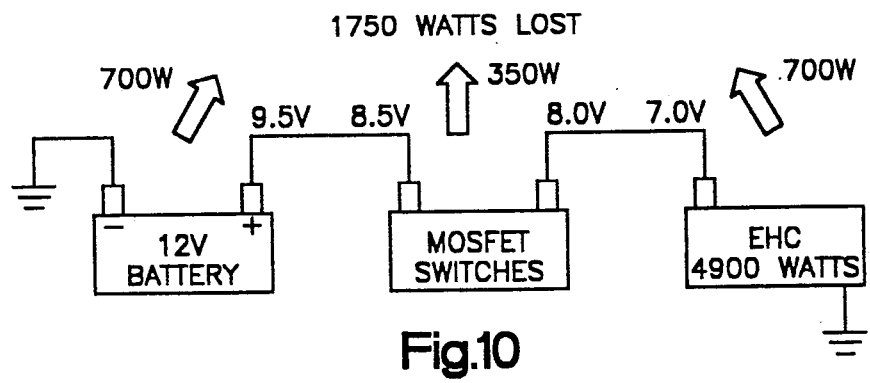
FIG. 10 is a diagram of a typical EHC system showing power losses with a MOSFET switch arrangement such as shown in FIG. 9 at a current draw of 750 amps, supplied with a 12 volt battery.

It has been found that up to 750 amps can be drawn from a heavy duty battery, switched easily, and used to preheat a corrugated thin metal monolith EHC. The high delivery currents have been found to heat relatively small volumes (automobile EHC size) of foil to temperatures in the range of 575° F. to 700° F. within from 2 to 10 seconds. FIG. 10 illustrates typical voltage levels and power losses for an EHC circuit drawing 750 amps. A 12 volt battery is drawn down to 9.5 volts with a 750 amp load during monolith heating, and losses in the cabling and MOSFET switch or switches cause the potential across the EHC to be about 6.7 volts. In such a system then, only about 70% of the power at the battery voltage of 9.5 volts (7125 watts) is available for heating at the EHC terminals. In actual practice, in 12 volt systems, power losses occur during the heating process such that the delivered power to the foil and the exhaust gas represents only about 50% of the power available at the battery terminals. Even at these relatively high current levels, the total energy drawn from the battery during a typical heating cycle is at a suitable level to achieve over 2000 heating cycles. The energy associated with a 30 second cycle drawing 750 amps is about 6 amp-hrs. This level represents only about 10% of the available energy in a typical 12 volt battery. Such energy losses are effectively supplemented by the alternator.

It should be noted that systems with supply voltages higher than 12 volts exhibit higher efficiencies; for example, efficiencies approach 98% with a 60 volt system, whereas with a 12 volt system, efficiencies are about 58% (see Table III below).

TABLE III

RESULTS OF DELIVERING POWER TO AN EHC AT VARIOUS SUPPLY EMF

| System EMF | 12.0 | 24.0 | 36.0 | 48.0 | 60.0 |
|---|---|---|---|---|---|
| Current Flow, Amps | 750 | 235 | 149 | 109 | 87 |
| EMF at EHC under load | 9.5 | 22.4 | 34.5 | 46.5 | 58.6 |
| % EMF at EHC @ load | 79% | 93% | 96% | 97% | 98% |
| EMF Drop across various circuit elements: | | | | | |
| Battery Int. Res. | 2.50 | 1.57 | 1.49 | 1.45 | 1.44 |
| MOSFET | 0.70 | 0.31 | 0.24 | 0.20 | 0.18 |
| Cable & Batt Term | 1.40 | 0.62 | 0.48 | 0.41 | 0.36 |
| EHC Connect. etc. | 0.70 | 0.22 | 0.14 | 0.10 | 0.08 |
| EHC Res. Elements | 6.70 | 21.28 | 33.65 | 45.83 | 57.94 |
| Total drop | 12.00 | 24.00 | 36.00 | 48.00 | 60.00 |
| Circuit Resistance: | | | | | |
| Battery | .00333 | .00667 | .01000 | .01333 | .01667 |
| MOSFETS | .00093 | .00132 | .00162 | .00187 | .00209 |
| Cables etc | .00187 | .00264 | .00323 | .00373 | .00417 |
| EHC Conn. etc. | .00093 | .00093 | .00093 | .00093 | .00093 |
| EHC Res. Elem. | .00893 | .09057 | .22583 | .42050 | .66978 |
| Tot. Res. Ohms | .01600 | .10213 | .24161 | .44037 | .69364 |
| Power Allocation, Watts: | | | | | |
| Battery | 1875 | 368 | 222 | 158 | 125 |
| MOSFETS | 525 | 73 | 36 | 22 | 16 |
| Cables, etc. | 1050 | 146 | 72 | 44 | 31 |
| EHC Term. etc. | 525 | 51 | 21 | 11 | 7 |
| EHC Res. Elem. | 5025 | 5002 | 5014 | 4996 | 5011 |
| Total Pwr. Out. | 9000 | 5640 | 5364 | 5232 | 5190 |
| EHC Elec. Effic. % | 56% | 89% | 93% | 95% | 97% |
| EHC Efficiency, Range-to-range, as an indication of the point of diminishing returns relative to increasing system voltage: | | | | | |
|  | | 159% | 105% | 102% | 101% |

Notes:
1. EHC power output is held constant at all system EMF's.
2. Battery int. resist. assumed proportional to Nom. EMF.
3. Connection resistance taken as constant throughout.
4. MOSFET & Cable res. increased with system voltage to represent likely wt. and cost tradeoffs on a vehicle.
5. EMF = ElectroMotive Force, or system supply voltage.

It should be noted that the negative terminal at the EHC may be centrally located as in FIG. 3, with the positive pole at the periphery (72) in FIG. 3, or the negative terminal may be peripherally located and the positive terminal centrally located.

The actuatable solid state switch offers the ability to modulate the power flow by using the pulse width modulation technique. This allows the EHC to be operated anywhere between zero and full power. This is an important improvement over the earlier solenoid controllers that operated only on an on/off basis. The ability to modulate power made possible a controller based on the temperature of the converter using a sensor such as a thermocouple rather than time. In this manner the EHC could be controlled using a thermocouple feedback. A time based schedule may be used, if desired.

MOSFETS are of two kinds according to present technology. There are the individual MOSFETS which are well known to those skilled in the art of solid state electronics. These are commercially available. Under a socalled "Hybrid MOSFET Technology", a plurality of "dies" can be mounted on a copper bus bar and connected by very fine gold wires to a parallel bus bar and actuated in unison. From 4 to 25 of such "dies" can be so mounted to switch the power in the desired range of wattage set forth herein. Reference may be had to U.S. Pat. No. 5,099,157 dated Mar. 24, 1992 to Meyer, and issued to Milwaukee Electric Tool Co. for details of this MOSFET technology.

Figure 11:
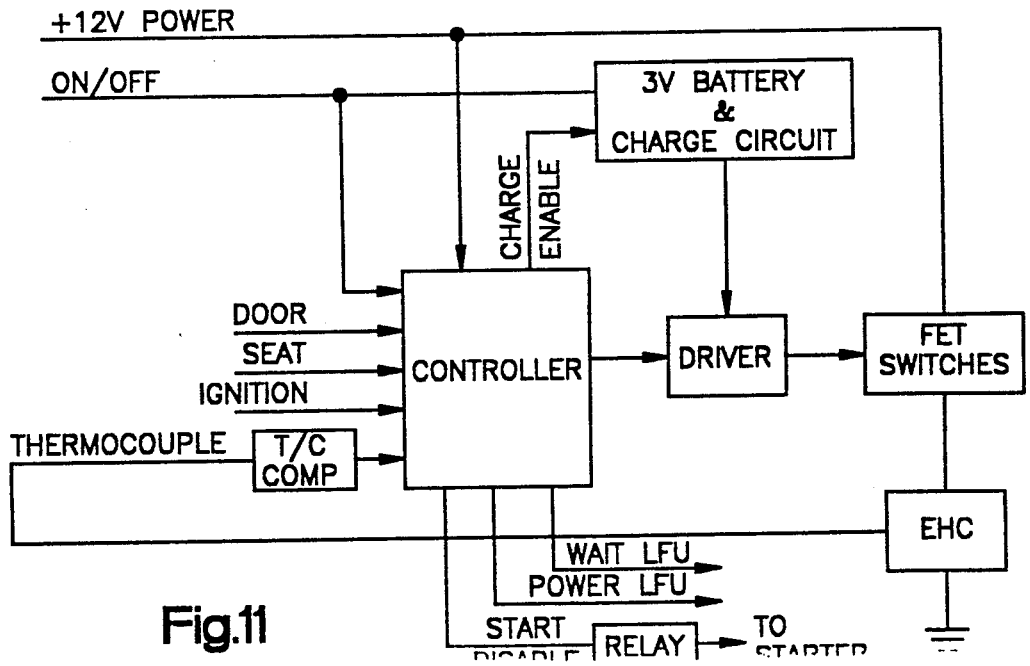
FIG. 11 is a solid state EHC controller diagram showing anticipatory heating means actuated by for example, a remote transmitter, a door switch, a seat switch, or an ignition key switch.
Figure 12:
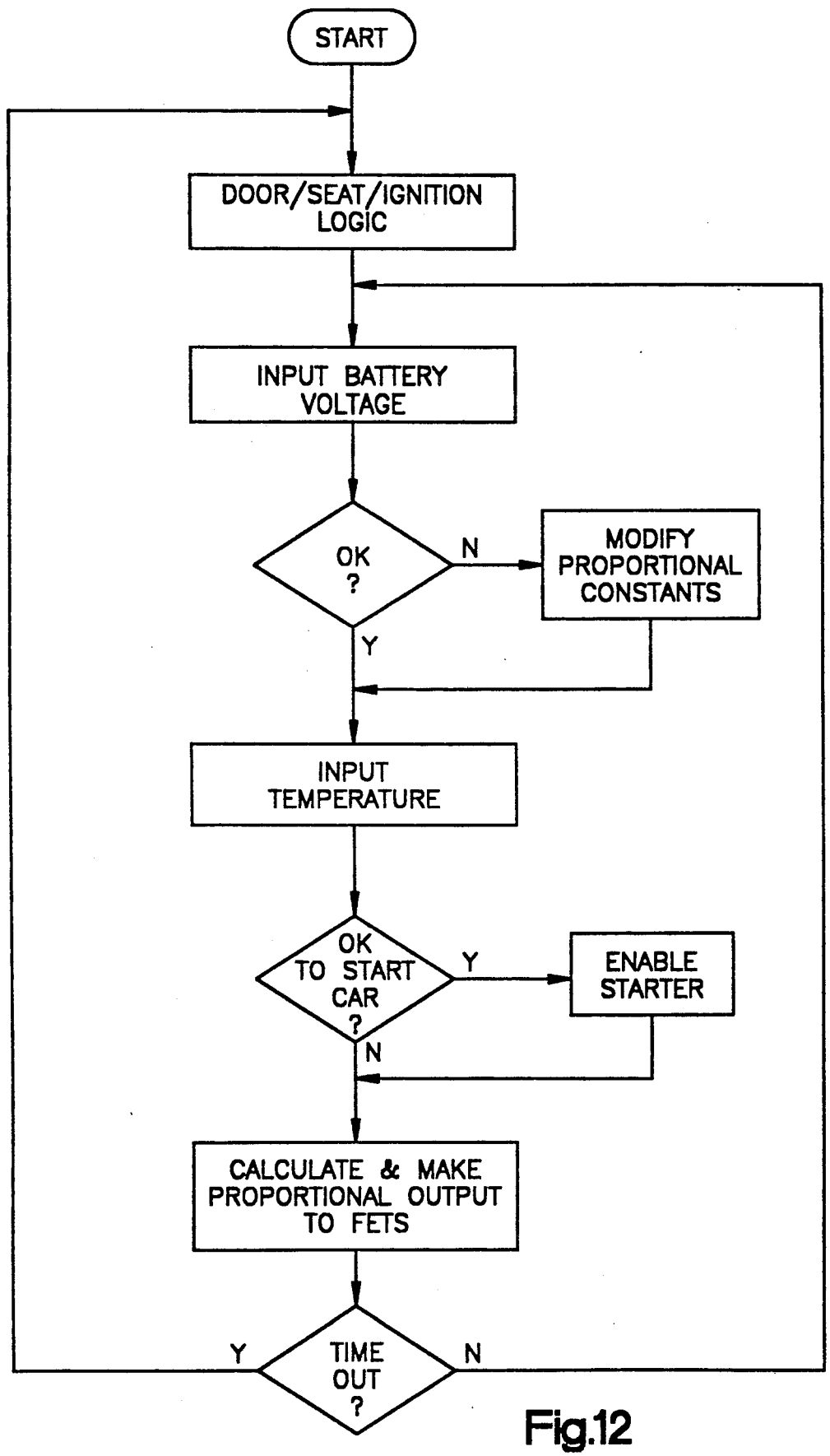
FIG. 12 is a software block diagram for a solid state EHC controller such as shown in FIG. 11.

FIG. 11 shows a simplified schematic diagram of a power controller that uses MOSFETS to control the power level to the EHC. FIG. 12 shows a basic software block diagram for this controller. Temperature is sensed in the EHC using a thermocouple embedded in the metal core 63 (FIG. 3). A thermocouple conditioner and set-point controller (T.C. comp. in FIG. 11) linearizes and conditions the low level thermocouple signal. For this, an Analog Devices, AD 597 AH Controller may be used (see U.S. Pat. No. 4,029,974). The controller compares the conditioned temperature signal with a set-point (typically about 650 F.) and generates a pulse width modulated output to the MOSFET switch which is proportional to the temperature difference. Full power is provided when this difference is, in a typical case, more than about 122 F. More sophisticated control algorithms, such as Proportional-Integral-Derivative (PID) may be used for improved temperature response characteristics.

The action of the temperature control is modified when low battery condition is sensed. Power is reduced under these conditions such that the battery voltage is maintained at an appropriate level.

Table IV below shows a power controller system performance at various power ratings with a 12 volt supply.

ing time before engine crank is enabled. Logic functions are also included for terminating the heating cycle and protecting the battery from excessive power drains.

At the heart of the power controller is a microcomputer chip, e.g., a Motorola MC68HC811A2 microcomputer. This chip contains a CPU, 2K of EPROM, 256 bytes of RAM, and analog and digital ports. In the case of a 12 volt system, the MOSFET switches are Motorola MTP50NO5EL, rated at 50 amps each. Higher voltage systems use similar switches with appropriate ratings. Desirably, power controllers for 12 volt systems in accordance herewith, utilize a bank of 18 such MOSFETS in parallel. However, higher voltage systems may use a lower number of MOSFETS depending on switch rating. A thermocouple conditioner and set-point controller, e.g., Analog Devices AD597 conditioner and set-point controller, is used to condition and compensate the thermocouple input. Alternatively, this conditioner can be replaced with software. As indicated above, it may be found desirable to connect an auxiliary battery in parallel with the main battery, which battery is dedicated to the EHC alone. It may range in voltage, for example, from 3 volts to 12 volts, e.g., a motor cycle battery or a lawn mower battery.

MOSFET switches are typically used with the load connected to the source side of the switch rather than the drain side. This arrangement would require voltage potential at the EHC at all times which is undesirable

TABLE IV

| Nom. EHC watts | 500 | 1000 | 1500 | 2000 | 2500 | 3500 | 5000 |
| --- | --- | --- | --- | --- | --- | --- | --- |
| Bat. Nom. volts | 12.0 | 12.0 | 12.0 | 12.0 | 12.0 | 12.0 | 12.0 |
| System Amps | 43 | 90 | 140 | 209 | 276 | 420 | 800 |
| Bat. EMF under load | 11.7 | 11.5 | 11.2 | 10.7 | 10.3 | 9.9 | 8.4 |
| % nom. under load | 98% | 96% | 93% | 90% | 86% | 83% | 70% |
| Voltage drop across various circuit elements: | | | | | | | |
| Bat. Int. Resist. | 0.26 | 0.54 | 0.84 | 1.25 | 1.66 | 2.10 | 3.60 |
| Power switch | 0.00 | 0.00 | 0.00 | 0.52 | 0.55 | 0.63 | 0.80 |
| Cables & Terminals | 0.13 | 0.27 | 0.42 | 0.52 | 0.55 | 0.67 | 0.96 |
| EHC Connections | 0.02 | 0.04 | 0.07 | 0.10 | 0.14 | 0.21 | 0.40 |
| EHC Int. Resist. | 11.59 | 11.15 | 10.67 | 9.60 | 9.10 | 8.39 | 6.24 |
| Total Drop | 12.00 | 12.00 | 12.00 | 12.00 | 12.00 | 12.00 | 12.00 |
| Resistance of various circuit elements (milliohms): | | | | | | | |
| Bat. Ints Resist. | 6.00 | 6.00 | 6.00 | 6.00 | 6.00 | 5.00 | 4.50 |
| Power switch | 0.00 | 0.00 | 0.00 | 2.50 | 2.00 | 1.50 | 1.00 |
| Cables & Terminals | 3.00 | 3.00 | 3.00 | 2.50 | 2.00 | 1.60 | 1.20 |
| EHC Connections | 0.50 | 0.50 | 0.50 | 0.50 | 0.50 | 0.50 | 0.50 |
| EHC Int. Resist. | 270.00 | 124.00 | 76.00 | 46.00 | 33.00 | 20.00 | 7.00 |
| Total Resist | 279.50 | 133.50 | 85.50 | 57.50 | 43.50 | 28.60 | 15.00 |
| Power allocation of various elements (watts): | | | | | | | |
| Bat. Int. Resist. | 11 | 48 | 118 | 261 | 457 | 880 | 2880 |
| Power switch | 0 | 0 | 0 | 109 | 152 | 264 | 640 |
| Cables & Terminals | 6 | 24 | 59 | 109 | 152 | 282 | 768 |
| EHC Connections | 1 | 4 | 10 | 22 | 38 | 88 | 320 |
| EHC Int. Resist. | 498 | 1002 | 1497 | 2003 | 2511 | 3521 | 4992 |
| Total Power Watts | 515 | 1079 | 1684 | 2504 | 3310 | 5035 | 9600 |
| EHC power Eff. | 97% | 93% | 89% | 80% | 76% | 70% | 52% |

It is desirable, although not essential, to use MOSFET switches above 1500 watts, and to use a relay for 1500 watts and below. MOSFET switches can be used for 1500 watts and below if desired, but it is not currently economically sound.

The power controller (FIG. 11) performs several logic functions. When enabled by the master on/off switch, its function is usually initiated when the car ignition key is turned on. Starting the car may be disabled until the converter set-point temperature is achieved. The circuit includes a "wait" light present on the dash that is on during the preheat cycle. A power light may also be provided as a visual indication to the driver of the converter power level. Low battery voltage is indicated by a flashing "wait" light. The preheat cycle can also be initiated by logic connected to doors or seats and/or a remote transmitter to minimize waiting from a grounding safety point of view. The desired arrangement necessitates the EHC to be connected to the drain side of the switch. When so connected, for example, in a 12 volt system, the MOSFET should desirably have more than 12 volts applied at the gate to make the switch function. This is accomplished with circuitry as indicated in FIG. 11 including a small 3 volt auxiliary battery, a charging mechanism for this battery, and a driver for the MOSFET switches. Higher supply voltages require correspondingly higher gate voltages.

Optionally, a doubler circuit may be used to generate the required gate voltage.

The ability to switch and control large currents has resulted in improvement of EHC structures. Designs are thus available in the 500 to 12000 watts range. Power in the range of 1500 to 12000 watts is most useful for monolith volumes above about 500 cubic centimeters (30.5 cubic inches). This power level is sufficient to reach pre-crank temperatures of 662 F in 10 to 30 seconds for monolith volumes of between about 10 cubic inches and 30.5 cubic inches. Lower power levels, e.g., 500 to 1000 watts can be used to advantage in smaller engines, e.g., lawn mowers, motor cycles, boats, power water skis or sleds, etc. The high power controller has allowed EHC's to incorporate higher cell densities up to 520 cells per square inch (81 cells per square centimeter) and still meet the heat-up target times. The higher cell density structures provide higher geometric surface area per unit volume than earlier structures resulting in improved thermal and mass transfer characteristics. The higher power levels are also important in enabling EHC applications to larger 6 and 8 cylinder engines as well as the smaller 1 to 3 liter engines. The exhaust flows in the larger displacement engines produce a substantial cooling effect on the EHC after start-up and high power availability is necessary to produce improved "light-off" performance and reasonable heat-up times. Moreover, the monoliths hereof are unitary and do not need to be subdivided as in the prior art.

As indicated above, the principles of this invention are applicable to accordion folded monoliths as well as to the spirally wound devices described above. The spirally wound structure is preferred. However, the utility and mode of operation in either case is the same.

Figure 13:
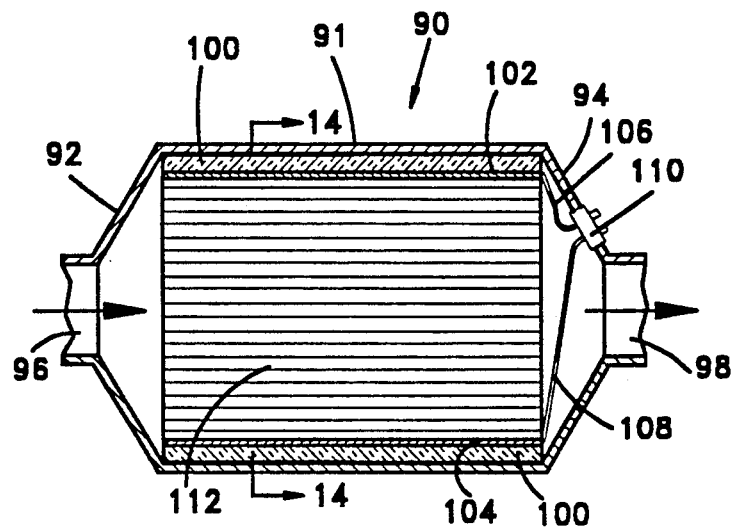
FIG. 13 is a cross sectional view of an EHC having an accordion folded corrugated thin metal foil monolith and showing electrical contacts at each end thereof (top and bottom) for passing an electric current therethrough for at least the initial start-up of operation.
Figure 14:
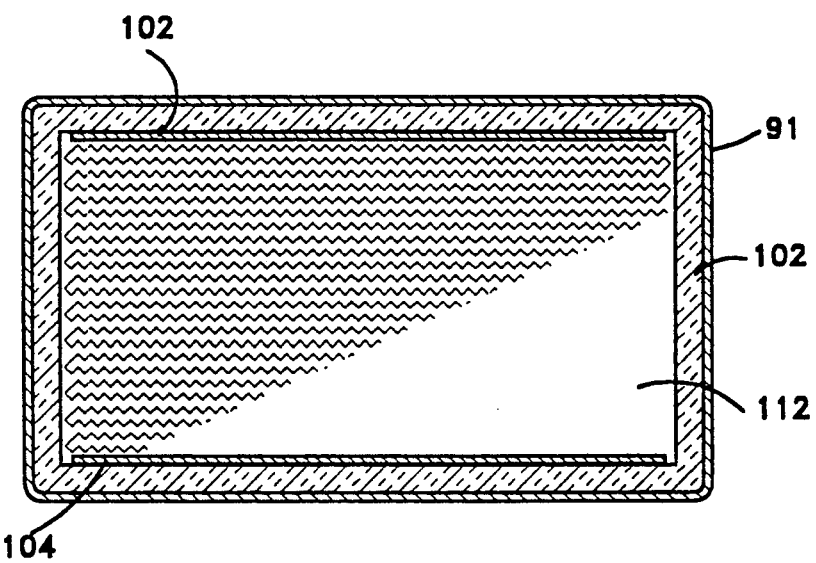
FIG. 14 is a transverse cross-sectional view showing the accordion folded nonnesting honeycomb, the straight openings therethrough, and the electrical contacts at each end of the accordion folded structure as it appears in the plane indicated by the line 14—14 in FIG. 13.

Accordingly, FIG. 13 is a cross-sectional longitudinal view of a device 90 in accordance with the present invention. The device 90 has an outer metallic housing 91, e.g., steel, which is rectangular in cross-section with end caps 92 and 94 thereon necked down to an inlet 96 and an outlet 98 for the passage of exhaust gas into and out of the device 90, respectively. As shown in FIG. 14, the housing 91 contains an accordion folded nonnesting corrugated stainless steel, or a corrugated nickel/chromium/aluminum/iron alloy (Haynes 214, supra) monolith 112 electrically isolated from the metallic outer shell of the housing 91 by isulation 100, which desirably completely surrounds the entire monolith 112.

Electrical power is supplied to the monolith through a power supply circuit as described herein, by electrode 102 lying along the upper extremity of the monolith 112 and electrode 104 lying along the lower extremity of the monolith 112 and having an opposite polarity. Monolith 112 serves as resistance between the electrodes 102 and 104, and when power is supplied to the electrodes 102 and 104, the monolith heats rapidly to the desired "light-off" temperature. Power is supplied to the electrodes 102 and 104 through leads 106 and 108 which exit the device 90 in a suitable external plug 110 also electrically isolated from the metallic housing 91 (FIG. 13). Instead of a single monolith of corrugated thin metal foil 112, there may be provided a plurality of accordion folded monoliths separated from the housing 91 by suitable insulation and connected in parallel to electrodes 102 and 104. Attachment of the electrodes is, in either case, conveniently by spot welding or brazing.

In one embodiment of the invention, a ferritic stainless steel strip having a width of 3.5 inches and a thickness of 0.0016", which dimension is typical for an accordion folded metal foil catalytic converter, has a resistance of 0.10 ohm per foot when cold. When hot, this resistance value rises to 0.12 ohm per foot. If a space velocity typical of those found in automotive designs is used, e.g., 100,000 hr. −1, then the cross-sectional area of the converter will be about 8 to 12 square inches. The embodiment 130 shown in FIG. 15 utilizes a pair of catalytic converters 136 and 142 in tandem relation in the same housing.

Figure 15:
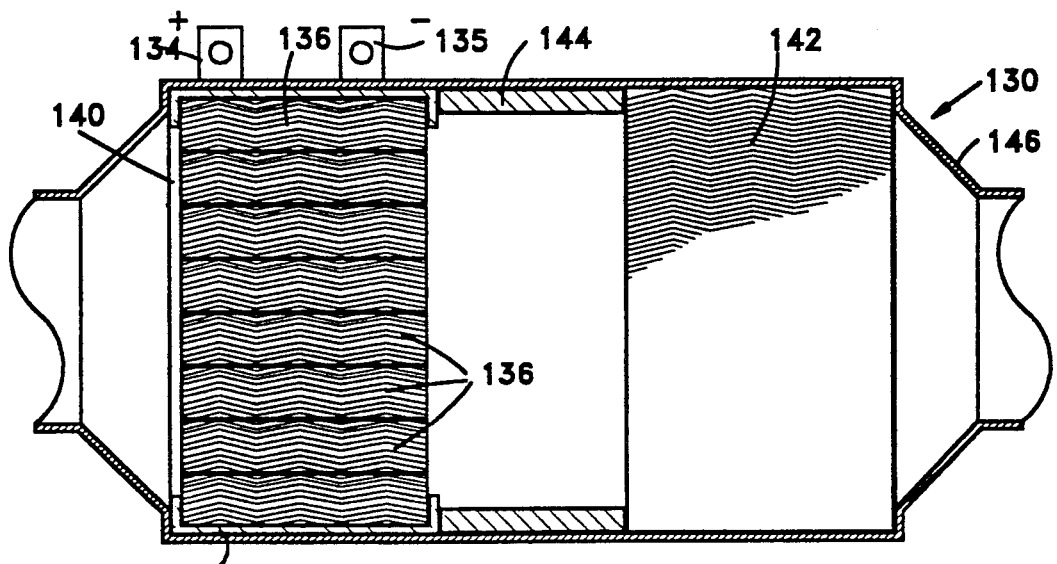
FIG. 15 is a top longitudinal cross-sectional view of an assembled converter showing one electrically heatable catalytic monolith core and a separate unheated accordion folded thin metal catalytic core in tandem relation in the same housing.

In FIG. 15 an electrically heatable core element 132 composed of a stack of 8 individual nonnesting herringbone corrugated, accordion folded monoliths welded at each end to two electrodes. The positive electrode is connected to an external terminal 134 and the negative electrode is connected to an external terminal 135. Insulation 138 is wrapped around the electrically heatable core unit 140.

Also shown in FIG. 15 is an unheated accordion folded, corrugated nonnesting thin metal monolith 142. As shown in FIG. 15, the unheated catalytic converter unit 142 is spaced from the electrically heatable core 140 by a steel spacer ring 144. There is, of course, no need to insulate this core 142 from the metal housing 146. Each of the units 140 and 142 has an axial dimension of about 3.5", and the spacer 144 is about 1.5" in axial dimension. The cores 140 and 142 may be juxtaposed to provide improved durability and resistance to telescoping. The cores 140 and 142 may be formed of ferritic stainless steel, or austenitic stainless steel, or Haynes 214 (supra) and corrugated in a herringbone or chevron pattern. If the core 142 is ceramic, it may be spaced from the EHC, or juxtaposed. Alternatively, there may be interposed in abutting relation between an EHC and the conventional catalytic converter, whether of metal or ceramic, a large cell (4 to 40 cells per square inch) retainer to inhibit telescoping of the EHC in use. Retainers of the types mentioned above may be beneficially used in those cases where the EHC and the conventional catalytic converter are in the same or different housings.

It should be noted that the voltage source may be from 12 to 60 or more volts. The power source may be formed of more than one 12 volt battery connected in series, if desired, or more than one 24 volt battery connected in series.

There has thus been provided a highly effective means of correcting the problem of atmospheric pollution from exhaust gases from an internal engine at start-up by inserting in an existing exhaust system an auxiliary electrically heatable catalytic converter, or fabricating an exhaust system with both an electrically heatable catalytic converter and a conventional, nonelectrically heated, catalytic converter(s). Neither the EHC or the conventional catalytic converter is sufficient alone to accomplish the desired result. A relatively small, and less expensive, EHC is normally of insufficient size to remove all the pollutants by itself in automotive applications. It is sufficient to remove some of the pollutants and to preheat the exhaust gases for conversion in the conventional converter(s), or in the alternative mode, to clean up the exhaust gas after it passes through the conventional converter. The conventional catalytic converter is insufficient to remove the pollutants on cold start-up. The improved power control system for use in conjunction with an EHC in an exhaust system enables the EHC to be effective in meeting pollution control goals.

What is claimed is:

1. An exhaust system for an internal combustion engine including an exhaust pipe, and comprising an electrically heatable catalytic converter in tandem relation with a separate conventional catalytic converter free of electrical heating means, and means for applying power of at least 500 watts for about 2 or more seconds to said electrically heatable catalytic converter, said means for applying power including at least one metal oxide semiconductor field effect transistor and means for actuating said transistor.

2. An exhaust system for an internal combustion engine including an exhaust pipe, and characterized by an electrically heatable catalytic converter in tandem relation with a separate conventional catalytic converter free of electrical heating means, and means for applying power of at least 1500 watts for from 2 to 30 seconds to said electrically heatable catalytic converter; said means for applying electrical power including a plurality of metal oxide semiconductor field effect transistors (MOSFETS) connected in parallel and means for actuating said transistors in unison; whereby the temperature in said electrically heatable catalytic converter can be elevated to at least about 650F.

3. An exhaust system for an internal combustion engine including an exhaust pipe, and characterized by an electrically heatable catalytic converter in tandem relation with a separate conventional catalytic converter free of electrical heating means, and means including a voltage source of from 12 to 60 volts capable of providing power at the rate of 1500 to 12000 watts for from 2 to 30 seconds prior to and at start-up to said electrically heatable catalytic converter, said electrically heatable catalytic converter having a total resistance of from 0.005 ohm to 2.2 ohms; said means for providing electrical power including a plurality of metal oxide semiconductor field effect transistors connected in parallel and means for actuating said transistors in unison; whereby the temperature in said electrically heatable catalytic converter may be elevated to at least about 650 F.

4. An exhaust system for an internal combustion engine as defined in claim 2 further comprising means including a voltage source of from 12 to 60 volts capable of providing power of from about 500 to 12000 watts for from 2 to 60 seconds prior to and at start-up to said electrically heatable catalytic converter, and wherein said electrically heatable catalytic converter has a total resistance of from 0.005 ohm to 2.2 ohms.

5. An exhaust system as defined in claim 2 wherein said means for applying electrical power includes means for applying power to said electrically heatable catalytic converter prior to starting said internal combustion engine.

6. An exhaust system in accordance with claim 5 wherein said means for applying electrical power includes temperature responsive means for applying current to said electrically heatable catalytic converter also after starting said internal combustion engine to maintain the temperature of the catalyst to at least about 650 F.

7. An exhaust system as defined in claim 1 wherein the electrically heatable catalytic converter is located upstream of said conventional catalytic converter.

8. An exhaust system as defined in claim 2 wherein the electrically heatable catalytic converter is located upstream of said conventional catalytic converter.

9. An exhaust system as defined in claim 3 wherein the electrically heatable catalytic converter is located upstream of said conventional catalytic converter.

10. An exhaust system as defined in claim 1 wherein said means for applying electrical power includes temperature responsive means for applying power to said electrically heatable catalytic converter also after starting the internal combustion engine to maintain the temperature to at least about 200 F.

11. An exhaust system as defined in claim 1 wherein the electrically heatable catalytic converter is located downstream of said conventional catalytic converter.

12. An exhaust system as defined in claim 2 wherein the electrically heatable catalytic converter is located downstream of said conventional catalytic converter.

13. An exhaust system as defined in claim 3 wherein the electrically heatable catalytic converter is located downstream of said conventional catalytic converter.

14. An exhaust system as defined in claim 1 wherein the conventional catalytic converter includes a ceramic honeycomb monolith.

15. An exhaust system as defined in claim 2 wherein the conventional catalytic converter includes a ceramic honeycomb monolith.

16. An exhaust system as defined in claim 3 wherein the conventional catalytic converter includes a ceramic honeycomb monolith.

17. An exhaust system as defined in claim 1 wherein the conventional catalytic converter includes a corrugated thin metal honeycomb monolith.

18. An exhaust system as defined in claim 2 wherein the conventional catalytic converter includes a corrugated thin metal honeycomb monolith.

19. An exhaust system as defined in claim 3 wherein the conventional catalytic converter includes a corrugated thin metal honeycomb monolith.

20. An exhaust system as defined in claim 1 wherein the electrically heatable catalytic converter includes a corrugated thin metal honeycomb monolith.

21. An exhaust system as defined in claim 2 wherein the electrically heatable catalytic converter includes a corrugated thin metal honeycomb monolith.

22. An exhaust system as defined in claim 3 wherein the electrically heatable catalytic converter includes a corrugated thin metal honeycomb monolith.

23. An exhaust system as defined in claim 22 wherein the thin metal honeycomb monolith is a thin high temperature resistive, corrosion resistant thin metal honeycomb monolith.

24. An exhaust system as defined in claim 1 wherein the electrically heatable catalytic converter includes a corrugated thin ferritic stainless steel honeycomb monolith.

25. An exhaust system as defined in claim 2 wherein the electrically heatable catalytic converter includes a corrugated thin ferritic stainless steel honeycomb monolith.

26. An exhaust system as defined in claim 3 wherein the electrically heatable catalytic converter includes a corrugated thin ferritic stainless steel honeycomb monolith.

27. An exhaust system as defined in claim 23 wherein the thin high temperature resistive, corrosion resistant metal is a nickel-containing metal.

28. An exhaust system as defined in claim 27 wherein the nickel-containing metal is a nickel/chromium-/aluminum/iron alloy.

29. An exhaust system as defined in claim 1 wherein the electrically heatable catalytic converter includes a honeycomb monolith formed of corrugated thin, high temperature resistive, corrosion resistant metal having a coating comprising gamma alumina on at least one surface thereof.

30. An exhaust system as defined in claim 1 wherein the electrically heatable catalytic converter includes a honeycomb monolith formed of corrugated thin ferritic stainless steel having a coating comprising gamma alumina on at least one surface thereof.

31. An exhaust system as defined in claim 2 wherein the electrically heatable catalytic converter includes a honeycomb monolith formed of corrugated thin ferritic stainless steel having a coating comprising gamma alumina on at least one surface thereof.

32. An exhaust system as defined in claim 3 wherein the electrically heatable catalytic converter includes a honeycomb monolith formed of corrugated thin ferritic stainless steel having a coating comprising gamma alumina on at least one surface thereof.

33. An exhaust system as defined in claim 27 wherein the corrugated high temperature resistive, corrosion resistant thin metal includes a coating comprising gamma alumina on at least one surface thereof.

34. An exhaust system as defined in claim 1 wherein the electrically heatable catalytic converter includes a honeycomb monolith formed of corrugated thin ferritic stainless steel having a coating including gamma alumina on at least one surface thereof and a noble metal catalyst deposited on the surface of the alumina coating.

35. An exhaust system as defined in claim 2 wherein the electrically heatable catalytic converter includes a honeycomb monolith formed of corrugated thin ferritic stainless steel having a coating of gamma alumina on at least one surface thereof and a noble metal catalyst deposited on the surface of the alumina coating.

36. An exhaust system as defined in claim 3 wherein the electrically heatable catalytic converter includes a honeycomb monolith formed of corrugated thin ferritic stainless steel having a coating of gamma alumina on at least one surface thereof and a noble metal catalyst deposited on the surface of the alumina coating.

37. An exhaust system as defined in claim 1 wherein the electrically heatable catalytic converter includes a honeycomb monolith formed of corrugated thin high temperature resistive, corrosion resistant metal having a coating of gamma alumina on at least one surface thereof and a noble metal catalyst deposited on the surface of the alumina coating.

38. An exhaust system as defined in claim 37 wherein the high temperature resistive, corrosion resistant metal is a nickel-containing metal.

39. An exhaust system as defined in claim 38 wherein the nickel-containing metal is a nickel/chromium-/aluminum/iron alloy.

40. An exhaust system as defined in claim 34 wherein the noble metal catalyst is selected from platinum, palladium, rhodium, ruthenium, and mixtures of two or more of said noble metal catalysts.

41. An exhaust system as defined in claim 35 wherein the noble metal catalyst is selected from platinum, palladium, rhodium, ruthenium, and mixtures of two or more of said noble metal catalysts.

42. An exhaust system as defined in claim 36 wherein the noble metal catalyst is selected from platinum, palladium, rhodium, ruthenium, and mixtures of two or more of said noble metal catalysts.

43. An exhaust system as defined in claim 20 wherein the corrugated thin metal honeycomb monolith has a cell density of from about 50 to 700 cells per square inch.

44. An exhaust system as defined in claim 21 wherein the corrugated thin metal honeycomb monolith has a cell density of from about 100 to 700 cells per square inch.

45. An exhaust system as defined in claim 22 wherein the corrugated thin metal honeycomb monolith has a cell density of from about 100 to 700 cells per square inch.

46. An exhaust system as defined in claim 17 wherein the thin metal honeycomb monolith includes a centrally located stainless steel core formed of a plurality of stainless steel rods each having secured thereto a pair of strips of corrugated thin metal foil and wound in a spiral about said rods to define a monolith core and each of said strips of corrugated thin metal foil having at its distal extremity a transversely extending metal bar secured thereto and when spirally wound, occupying a position on the outer periphery of said core; and a conductive binder ring wrapped about said monolith and secured to said strips.

47. An exhaust system as defined in claim 18 wherein the thin metal honeycomb monolith includes a centrally located stainless steel core formed of a plurality of stainless steel rods each having secured therto a pair of strips of corrugated thin metal foil and wound in a spiral about said rods to define a monolith core and each of said strips of corrugated thin metal foil having at its distal extremity a transversely extending metal bar secured thereto and when spirally wound, occupying a position on the outer periphery of said core; and a conductive binder ring wrapped about said monolith core and secured to said strips.

48. An exhaust system as defined in claim 19 wherein the thin metal honeycomb monolith includes a centrally located stainless steel core formed from a plurality of stainless steel rods each having secured thereto a pair of strips of corrugated thin metal foil and wound in a spiral about said rods to define a monolith core and each of said strips of corrugated thin metal foil having at its distal extremity a transversely extending metal bar secured thereto and when spirally wound, occupying a position on the outer periphery of said core; and a conductive binder ring wrapped about said monolith core and secured to said strips.

49. An exhaust system as defined in claim 46 further characterized by an electrical terminal secured to and radially projecting from said conductor binder ring.

50. An exhaust system as defined in claim 47 further characterized by an electrical terminal secured to and radially projecting from said conductor binder ring.

51. An exhaust system as defined in claim 48 further characterized by an electrical terminal secured to and radially projecting from said conductor binder ring.

52. An exhaust system as defined in claim 46 further characterized by an electrical terminal secured to and radially projecting from said conductor binder ring, said system being further characterized by a housing having an opening for said electrical terminal, and an internally disposed insulating layer of ceramic fibers surrounding the core.

53. An exhaust system as defined in claim 47 further characterized by an electrical terminal secured to and radially projecting from said conductor binder ring, said system being further characterized by a housing having an opening for said electrical terminal, and an internally disposed insulating layer of ceramic fibers surrounding the core.

54. An exhaust system as defined in claim 48 further characterized by an electric terminal secured to and radially projecting from said conductor binder ring, said system being further characterized by a housing having an opening for said electrical terminal, and an internally disposed insulating layer of ceramic fibers surrounding the core.

55. An exhaust system as defined in claim 46 further characterized by an electric terminal secured to and radially projecting from said conductor binder ring and being further characterized by a housing having an opening for said electric terminal and wherein said housing includes an end cap adaptor at each end thereof, said adaptors being dimensioned to accept said exhaust pipe.

56. An exhaust system as defined in claim 47 further characterized by an electric terminal secured to and radially projecting from said conductor binder ring and being further characterized by a housing having an opening for said electric terminal and wherein said housing includes an end cap adaptor at each end thereof, said adaptors being dimensioned to accept said exhaust pipe.

57. An exhaust system as defined in claim 48 further characterized by an electric terminal secured to and radially projecting from said conductor binder ring and being further characterized by a housing having an opening for said electric terminal and wherein said housing includes an end cap adaptor at each end thereof, said adaptors being dimensioned to accept said exhaust pipe.

58. An exhaust system as defined in claim 46 further characterized by an electric terminal secured to and radially projecting from said conductor binder ring and said housing having an opening for said electric terminal and further including means for electrically insulating said terminal from said housing.

59. An exhaust system as defined in claim 47 further characterized by an electrical terminal secured to and projecting from said conductor binder ring and said housing having an opening for said electric terminal and further including means for electrically insulating said terminal from said housing.

60. An exhaust system as defined in claim 48 further characterized by an electric terminal secured to an radially projecting from said conductor binder ring and said housing having an opening for said electric terminal and further including means for electrically insulating said terminal from said housing.

61. An exhaust system as defined in claim 46 further including at least one battery and means for connecting said centrally located stainless steel rods to the negative pole of said at least one battery, and means for connecting said terminal to the positive pole of said at least one battery.

62. An exhaust system as defined in claim 48 further including at least one battery and means for connecting said centrally located stainless steel rods to the negative pole of said at least one battery, and means for connecting said terminal to the positive pole of said at least one battery.

63. An exhaust system as defined in claim 48 further including at least one battery and means for connecting said centrally located stainless steel rods to the negative pole of said at least one battery, and means for connecting said terminal to the positive pole of said at least one battery.

64. An electrically heatable catalytic converter comprising a housing, and an electrically heatable catalytic core including a plurality of centrally located stainless steel rods each having secured thereto a pair of strips of corrugated thin metal foil wound in a spiral about said centrally located bars and each one of said pair of strips of corrugated thin metal foil having a transversely extending metal strip secured to the distal extremity thereof; a conductive binder ring surrounding said core and attached to the transversely extending metal strips, a terminal radially projecting from said binder ring and extending through said housing, means for insulating said terminal from said housing, and insulating means between said housing and said core.

65. An exhaust system for an internal combustion engine including at least one 12 volt battery, an exhaust pipe, an electrically heatable catalytic converter, and power control means for providing a modulated electrical power of at least 500 watts for at least from 2 to 60 seconds to said electrically heatable catalytic converter, said power control means including at least one metal oxide semiconductor field effect transistor connected to said battery, means for sensing the temperature of said electrically heatable catalytic converter, means responsive to said temperature sensing means for controlling the application of electrical power to said electrically heatable catalytic converter whereby the temperature is rapidly raised to and maintained at a temperature in excess of the light-off temperature of pollutant materials in said exhaust, and said controlling means including a microcomputer chip including a CPU, at least 2K of EPROM, at least 256 bytes of RAM, and analog and digital ports, said electrically heatable catalytic converter including a corrugated thin high temperature resistive, corrosion resistant metal foil monolith and having a cell density of from about 100 to about 700 cells per square inch, and a noble metal catalyst deposited in said cells.

66. An exhaust system for an internal combustion engine including at least one 12 volt battery, an exhaust pipe, an electrically heatable catalytic converter in tandem relation with a separate catalytic converter free of electrical heating means, and power control means for providing a modulated electrical power of at least 1500 watts for at least from 2 to 30 seconds to said electrically heatable catalytic converter, said power control means including a plurality of metal oxide semiconductor field effect transistors connected in parallel to said battery, means for sensing the temperature of said electrically heatable catalytic converter, means responsive to said temperature sensing means for controlling the application of electrical power to said electrically heatable catalytic converter whereby the temperature is rapidly raised to and maintained at a temperature in excess of the light-off temperature of pollutant material in said exhaust, said controlling means including a microcomputer chip including a CPU, at least about 2K of EPROM, at least about 256 bytes of RAM and analog and digital ports, said electrically heatable catalytic converter including a corrugated thin ferritic stainless steel monolith having a cell density of from 100 to 700 cells per square inch, and a noble metal catalyst deposited in said cells.

67. A method for accelerating the response of an exhaust gas pollutant conversion catalyst in the exhaust line from an internal combustion engine and wherein the catalyst consists essentially of a corrugated thin high temperature resistive, corrosion resistant metal foil having a thin coating of a refractory metal oxide and a noble metal catalyst deposited thereon, comprising directly heating said foil with electric power from at least one 12 volt battery, at a power level in excess of 500 watts from a voltage source, modulating said power over a duty cycle of from 0% to 100% and switching said power through an actuatable solid state switch together with means for actuating said actuatable solid state switch.

68. A method for accelerating the response of an exhaust gas pollutant conversion catalyst in the exhaust from an internal combustion engine, and wherein the catalyst consists essentially of a corrugated stainless steel foil having a thin coating of refractory metal oxide and a noble metal catalyst deposited thereon, comprising directly heating said stainless steel foil with an electric current in excess of 150 amps from a voltage source, modulating said current over a duty cycle of from 0% to 100% and switching said current through a plurality of actuatable solid state switches connected in parallel together with means for actuating said switches in unison, whereby the temperature of the catalyst is raised to at least about 650 F. in from 2 to 30 seconds.

69. A method in accordance with claim 68 wherein the actuatable solid state switches are metal oxide semiconductor field effect transistors.

70. A method in accordance with claim 68 wherein the voltage source includes at least one 12 volt automobile battery.

71. A method in accordance with claim 68 wherein the voltage source provides an EMF in the range of from 12 to 60 volts.

72. A method in accordance with claim 68 wherein the voltage source is connected in parallel to the source side of the transistors and the electrically heatable catalytic converter is connected in parallel to the drain side of said transistors.

73. A system for accelerating the response of an exhaust gas pollution conversion catalyst comprising, an internal combustion engine exhaust line, an electrically heatable catalytic converter including an electrically heatable corrugated thin metal foil monolith having a thin coating of refractory metal oxide on the foil surfaces thereof, and a noble metal catalyst deposited thereon, an electric heating circuit including a voltage source capable of providing a current of at least about 150 amps for up to 30 seconds prior to engine start-up, means connected to said voltage source for modulating said electric current according to a duty cycle ranging from 0% to 100%, means for switching said electric current through a plurality of actuatable solid state switches connected in parallel and means for actuating said switches in unison.

74. A system in accordance with claim 73 wherein the voltage source is an automotive vehicle wet cell battery.

75. A system in accordance with claim 73 wherein the voltage source is a direct current voltage source, and said voltage source is connected in parallel to the source sides of said actuatable solid state switches.

76. A system in accordance with claim 75 which is further characterized by gate driver means for actuating said actuatable solid state switches in unison.

77. A system in accordance with claim 73 which is further characterized by an auxiliary battery in series with said voltage source and connected to gate driver means for actuating said actuatable solid state switches in unison.

78. A system in accordance with claim 73 wherein the actuatable solid state switches are metal oxide semiconductor field effect transistors.

79. An exhaust system as defined in claim 1 wherein the electrically heatable catalytic converter is in juxtaposed relation with the conventional catalytic converter.

80. An exhaust system as defined in claim 2 wherein the electrically heatable catalytic converter is in juxtaposed relation with the conventional catalytic converter.

81. An exhaust system as defined in claim 3 wherein the electrically heatable catalytic converter is in juxtaposed relation with the conventional catalytic converter.

82. An exhaust system for an internal combustion engine including at least one 12 volt battery, an exhaust pipe, an electrically heatable catalytic converter, and power control means for providing a modulated electrical power of at least 500 watts for at least 2 seconds to said electrically heatable catalytic converter, said power control means including at least one metal oxide semiconductor field effect transistor connected to said battery, means for sensing the temperature of said electrically heatable catalytic converter, means responsive to said temperature sensing means for controlling the application of electrical power from said at least one transistor to said electrically heatable catalytic converter whereby the temperature is rapidly raised to and maintained at a temperature in excess of the light-off temperature of pollutant materials in said exhaust.

83. An exhaust system for an internal combustion engine including at least one 12 volt battery, an exhaust pipe, an electrically heatable catalytic converter, and power control means for providing a modulated electrical power of at least 1500 watts for from 2 to 30 seconds to said electrically heatable catalytic converter, said power control means including a plurality of metal oxide semiconductor field effect transistors connected in parallel to said battery, means for sensing the temperature of said electrically heatable catalytic converter, means responsive to said temperature sensing means for controlling the application of electrical power from said transistors to said electrically heatable catalytic converter whereby the temperature is rapidly raised and maintained at a temperature in excess of the light-off temperature of pollutant materials in said exhaust.

84. An exhaust system as defined in claim 82 wherein the electrically heatable catalytic converter includes a polycellular corrugated thin metal foil monolith.

85. An exhaust system as defined in claim 83 wherein the electrically heatable catalytic converter includes a polycellular corrugated thin metal foil monolith.

86. An exhaust system as defined in claim 82 further characterized by an auxiliary battery power source in series with said at least one 12 volt battery.

87. An exhaust system as defined in claim 83 further characterized by an auxiliary battery power source in series with said at least one 12 volt battery.

88. An exhaust system as defined in claim 82 wherein said controlling means includes a microcomputer chip containing a CPU, at least 2K of EPROM, at least about 256 bytes of RAM, and analog and digital ports, and connected to said field effect transistors.

89. An exhaust system as defined in claim 83 wherein said controlling means includes a microcomputer chip containing a CPU, at least 2K of EPROM, at least about 256 bytes of RAM, and analog and digital ports, and connected to said field effect transistors.

90. An exhaust system for an internal combustion engine including a battery rated at from 12 to 60 volts, an exhaust pipe, an electrically heatable catalytic converter, and power control means for providing modulated electric power of at least 500 watts for at least 2 seconds to said electrically heatable catalytic converter, said power control means comprising a plurality of actuatable metal oxide semiconductor field effect transistors connected in parallel to said battery, means for sensing the temperature of said electrically heatable catalytic converter, means responsive to said temperature sensing means for controlling the application of electrical power from said actuatable metal oxide semiconductor field effect transistors to said electrically heatable catalytic converter, means for actuating said actuatable metal oxide semiconductor field effect transistors, whereby the temperature of said electrically heatable catalytic converter is rapidly raised and maintained at a temperature in excess of the light off temperature of pollutant material in the exhaust emanating from said internal combustion engine.

91. Power control means for an electrically heatable catalytic converter for treating exhaust from an internal combustion engine comprising a battery power source, a plurality of MOSFET (metal oxide semiconductor field effect transistor) transistors connected in parallel and to said battery power source, means for sensing the temperature of said electrically heatable catalytic converter, and means responsive to said temperature sensing means for controlling the application of electrical power from said transistors to said electrically heatable catalytic converter.

92. A power control in accordance with claim 91 wherein the electrically heatable catalytic converter includes a polycellular corrugated thin metal foil monolith.

93. A power control in accordance with claim 91 further characterized by an auxiliary battery power source in series with said first mentioned battery power source.

94. A power control in accordance with claim 91 wherein the controlling means includes a microcomputer chip containing a CPU, at least about 2K of EPROM, at least 256 bytes of RAM, and analog and digital ports, and connected to said field effect transistors.

* * * * *